United States Patent
Yamamoto et al.

(10) Patent No.: US 9,076,825 B2
(45) Date of Patent: Jul. 7, 2015

(54) SEMICONDUCTOR DEVICE AND METHOD FOR MANUFACTURING THE SEMICONDUCTOR DEVICE

(71) Applicant: Semiconductor Energy Laboratory Co., Ltd., Atsugi-shi, Kanagawa-ken (JP)

(72) Inventors: Yoshiaki Yamamoto, Tokyo (JP); Koichi Ito, Kanagawa (JP); Motomu Kurata, Kanagawa (JP); Taiga Muraoka, Kanagawa (JP); Daigo Ito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/162,364

(22) Filed: Jan. 23, 2014

(65) Prior Publication Data

US 2014/0209898 A1    Jul. 31, 2014

(30) Foreign Application Priority Data

Jan. 30, 2013 (JP) ................................. 2013-016182

(51) Int. Cl.
*H01L 29/10* (2006.01)
*H01L 29/66* (2006.01)
*H01L 29/786* (2006.01)

(52) U.S. Cl.
CPC .... *H01L 29/66969* (2013.01); *H01L 29/78696* (2013.01)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Kyoung Lee
(74) *Attorney, Agent, or Firm* — Fish & Richardson P.C.

(57) ABSTRACT

When an oxide semiconductor film is microfabricated to have an island shape, with the use of a hard mask, unevenness of an end portion of the oxide semiconductor film can be suppressed. Specifically, a hard mask is formed over the oxide semiconductor film, a resist is formed over the hard mask, light exposure is performed to form a resist mask, the hard mask is processed using the resist mask as a mask, the oxide semiconductor film is processed using the processed hard mask as a mask, the resist mask and the processed hard mask are removed, a source electrode and a drain electrode are formed in contact with the processed oxide semiconductor film, a gate insulating film is formed over the source electrode and the drain electrode, and a gate electrode is formed over the gate insulating film, the gate electrode overlapping with the oxide semiconductor film.

9 Claims, 16 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 * | 6/2008 | Ishii et al. | 257/72 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,247,276 B2 | 8/2012 | Kondo et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 * | 11/2007 | Kim et al. | 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0277658 A1 * | 11/2008 | Lee et al. | 257/43 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0240990 A1 * | 10/2011 | Yamazaki | 257/43 |
| 2013/0140554 A1 | 6/2013 | Yamazaki et al. | |
| 2013/0161605 A1 | 6/2013 | Sasagawa et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | 20041114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M,"Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR MANUFACTURING THE SEMICONDUCTOR DEVICE

BACKGROUND OF THE INVENTION

1. Field of the Invention

The present invention relates to products (including machines, manufactures, and compositions of matters) and processes (including simple methods and production methods). In particular, one embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device each including an oxide semiconductor.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a transistor formed using zinc oxide or an In—Ga—Zn-based oxide as an oxide semiconductor is disclosed (see Patent Document 1).

REFERENCE

[Patent Document 1] Japanese Published Patent Application No. 2006-165528

SUMMARY OF THE INVENTION

In order to achieve high-speed operation, low power consumption, high integration, or the like of a transistor, it is necessary to miniaturize a transistor.

However, it is concerned that a yield of transistors in the manufacturing process is decreased due to miniaturization thereof. For example, when an oxide semiconductor film which serves as a channel is microfabricated to have an island shape, unevenness may be generated at an end portion of the oxide semiconductor film, which might cause an increase in variations in the shape of the oxide semiconductor film and bring about an adverse effect on electrical characteristics or reliability of the transistor.

Therefore, an object of one embodiment of the present invention is to provide a miniaturized transistor or the like having favorable electrical characteristics in a high yield.

Further, another object of one embodiment of the present invention is to achieve high performance, high reliability, and high productivity also in a semiconductor device or the like including the transistor.

Another object of one embodiment of the present invention is to provide a novel semiconductor device or the like. Another object of one embodiment of the present invention is to provide a novel method for manufacturing a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

In one embodiment of the present invention, when an oxide semiconductor film is microfabricated to have an island shape, with the use of a hard mask, unevenness of an end portion of the oxide semiconductor film can be suppressed. Further, a channel length can be shortened, with the use of a resist mask having a small line width, which is formed by exposing a resist to light using electron beam exposure, liquid immersion exposure, or the like. The specific structure and manufacturing method are described below.

One embodiment of the present invention is a semiconductor device including an oxide semiconductor film over an insulating surface; a source electrode and a drain electrode which are in contact with the oxide semiconductor film; a gate insulating film over the source electrode and the drain electrode; and a gate electrode over the gate insulating film, the gate electrode overlapping with the oxide semiconductor film, in which a distance between the source electrode and the drain electrode is greater than or equal to 1 nm and less than or equal to 30 nm, and in which a standard deviation of line edge roughness of the oxide semiconductor film is less than or equal to 4 nm.

Further, in the above structure, the semiconductor device includes a first oxide film and a second oxide film between which the oxide semiconductor film is positioned, in which an energy of a bottom of a conduction band in each of the first oxide film and the second oxide film is closer to a vacuum level than an energy of a bottom of a conduction band in the oxide semiconductor film by 0.05 eV or higher and 2 eV or lower.

Further, in the above structure, the semiconductor device includes a first low-resistance region between the oxide semiconductor film and the source electrode and a second low-resistance region between the oxide semiconductor film and the drain electrode.

Further, one embodiment of the present invention is a method for manufacturing a semiconductor device, which includes the following steps: an oxide semiconductor film is deposited over an insulating surface; a hard mask is formed over the oxide semiconductor film; a resist is formed over the hard mask; light exposure is performed to form a resist mask; the hard mask is processed using the resist mask as a mask; the resist mask is removed; the oxide semiconductor film is processed using the processed hard mask as a mask; the processed hard mask is removed; a source electrode and a drain electrode which are in contact with the processed oxide semiconductor film are formed; a gate insulating film is formed over the source electrode and the drain electrode; and a gate electrode is formed over the gate insulating film, the gate electrode overlapping with the oxide semiconductor film.

Further, one embodiment of the present invention is a method for manufacturing a semiconductor device, which includes the following steps: an oxide semiconductor film is deposited over an insulating surface; a hard mask is formed over the oxide semiconductor film; an organic coating film is formed over the hard mask; a resist is formed over the organic coating film; light exposure is performed to form a resist mask; the organic coating film and the hard mask are processed using the resist mask as a mask; the resist mask and the processed organic coating film are removed; the oxide semiconductor film is processed using the processed hard mask as a mask; the processed hard mask is removed; a source electrode and a drain electrode which are in contact with the processed oxide semiconductor film are formed; a gate insulating film is formed over the source electrode and the drain electrode; and a gate electrode is formed over the gate insulating film, the gate electrode overlapping with the oxide semiconductor film.

Further, in the above manufacturing method, the light exposure is electron beam exposure or liquid immersion exposure.

Note that in this specification, a hard mask refers to a mask formed using a material (a metal material or an insulating material) other than a material of a resist.

Further, in this specification, line edge roughness refers to the deviation of a resist pattern edge from its ideal line.

With the above structure, a miniaturized transistor having high electrical characteristics can be provided in a high yield.

Further, with the above structure, also in a semiconductor device including the transistor, high performance, high reliability, and high productivity can be achieved.

DETAILED DESCRIPTION OF THE INVENTION

Figure 1A:
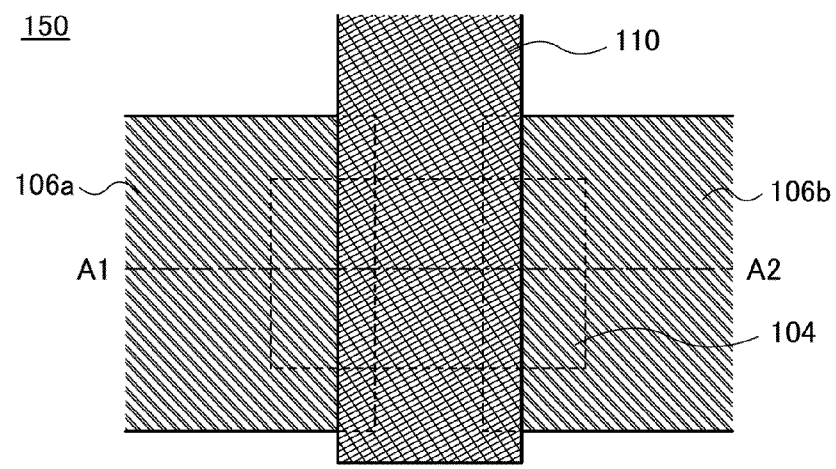
FIGS. 1A and 1B are a plan view and a cross-sectional view illustrating a semiconductor device of one embodiment of the present invention.

Embodiments are described in detail with reference to drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

In this specification, the term "parallel" indicates that the angle between two straight lines is greater than or equal to −10° and less than or equal to 10°, and accordingly includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Embodiment 1

In this embodiment, a transistor which is a semiconductor device of one embodiment of the present invention is described with reference to drawings.

Figure 1B:
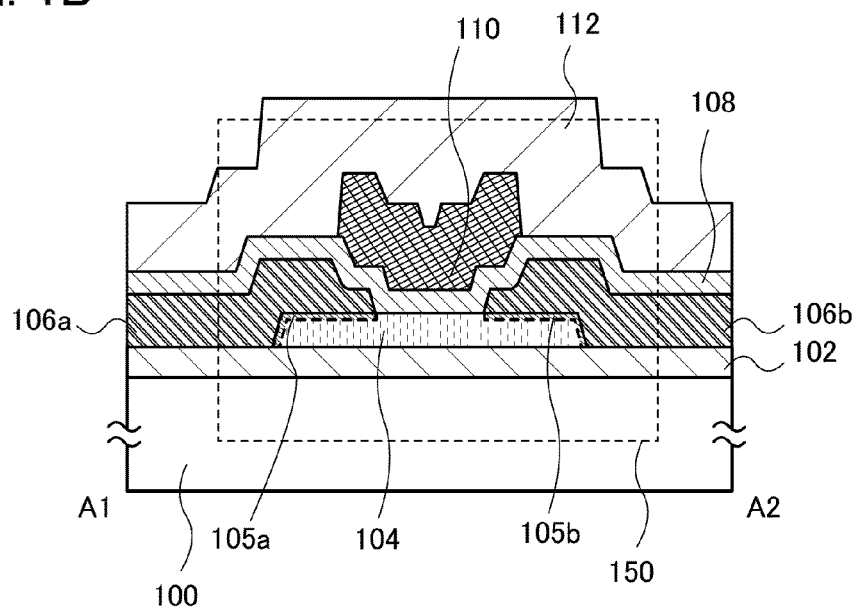

FIGS. 1A and 1B are a top view and a cross-sectional view of a transistor 150 of one embodiment of the present invention. FIG. 1A is the top view, and a cross section taken along a dashed-dotted line A1-A2 in FIG. 1A is illustrated in FIG. 1B. Note that for simplification of the drawing, some components in the top view in FIG. 1A are not illustrated.

The transistor 150 illustrated in FIGS. 1A and 1B includes a base insulating film 102 over a substrate 100, an oxide semiconductor film 104 over the base insulating film 102, a low-resistance region 105a and a low-resistance region 105b in upper portions of the oxide semiconductor film 104, a source electrode 106a in contact with the low-resistance region 105a, a drain electrode 106b in contact with the low-resistance region 105b, a gate insulating film 108 over the oxide semiconductor film 104, the source electrode 106a, and the drain electrode 106b, and a gate electrode 110 over the gate insulating film 108. In addition, an insulating film 112 may be provided over the gate insulating film 108 and the gate electrode 110. Note that the insulating film 112 is provided as needed and another insulating film may be further provided thereover.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, in some cases, microfabrication is difficult due to the shrinkage of the substrate 100, which is caused by heat treatment or the like in a manufacturing process of the semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment which is performed for an hour at 400° C., preferably 450° C., further preferably 500° C. is less than or equal to 10 ppm, preferably less than or equal to 5 ppm, further preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The base insulating film 102, from which oxygen is released by heat treatment, has a function of supplying the oxygen to the oxide semiconductor film as well as a function of preventing diffusion of an impurity from the substrate 100; thus, the base insulating film 102 is preferably an insulating film containing oxygen, further preferably an insulating film containing excess oxygen. Note that in the case where the substrate 100 is a substrate where another device is formed as described above, the base insulating film 102 has also a function as an interlayer insulating film. In that case, the base insulating film 102 is preferably subjected to planarization treatment such as chemical mechanical polishing (CMP) treatment so as to have a flat surface.

As the base insulating film 102, for example, a single layer selected from a silicon oxide film, a gallium oxide film, a zinc oxide film, an aluminum oxide film, a gallium zinc oxide film, a silicon nitride film, a silicon oxynitride film, an aluminum oxynitride film, and a silicon nitride oxide film or a stack of any of these films can be used.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in which heat treatment is performed such that a temperature of a film surface is higher than or equal to 100° C. and lower than or equal to 700° C., preferably higher than or equal to 100° C. and lower than or equal to 500° C.

Further, the film from which oxygen is released by heat treatment may contain a peroxide radical. Specifically, the spin density attributed to a peroxide radical is $5\times10^{17}$ spins/cm$^3$ or higher. Note that the film containing a peroxide radical may have an asymmetric signal at a g factor of around 2.01 generated in ESR.

The insulating film containing excess oxygen may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

The oxide semiconductor film 104 is an oxide semiconductor film including at least indium. The oxide semiconductor film 104 may include zinc in addition to indium, for example.

The concentration of silicon in the oxide semiconductor film 104 is described below. In order to obtain stable electrical characteristics of a transistor, it is effective to reduce the concentration of impurities in the oxide semiconductor film 104 so that the oxide semiconductor film 104 becomes intrinsic or substantially intrinsic. Specifically, the carrier density of the oxide semiconductor film is preferably set to lower than $1\times10^{17}$/cm$^3$, lower than $1\times10^{15}$/cm$^3$, or lower than $1\times10^{13}$/cm$^3$. In the oxide semiconductor film, a light element, a semimetal element, a metal element, and the like (lower than 1 atomic %), other than main components serve as impurities. For example, hydrogen, nitrogen, carbon, silicon, and germanium serve as impurities in the oxide semiconductor film.

Further, in the oxide semiconductor film 104, hydrogen and nitrogen generate a donor level, and increase the carrier density. The concentration of hydrogen in the oxide semiconductor film 104, which is measured by secondary ion mass spectrometry (SIMS), is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 104, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentrations of hydrogen and nitrogen in the gate insulating film 108, which is adjacent to the oxide semiconductor film 104, in order to reduce the concentrations of hydrogen and nitrogen in the oxide semiconductor film 104.

Further, the concentration of alkali metal or alkaline earth metal of the oxide semiconductor film 104, which is measured by SIMS, is set to lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor might be increased.

A transistor in which a highly purified oxide semiconductor film is used for a channel formation region as described above has an extremely low off-state current, and the off-state current standardized on the channel width of the transistor can be as low as several yoktoamperes per micrometer to several zeptoamperes per micrometer.

The oxide semiconductor film can be microfabricated in the following manner. Firstly, a hard mask, an organic coating film, and a resist are formed over the oxide semiconductor film. Next, electron beam exposure is performed, so that a resist mask is formed over the organic coating film. Then, the hard mask and the organic coating film are etched and then the oxide semiconductor film is etched using the resist mask and the hard mask as masks. In this manner, line edge roughness (LER) of the oxide semiconductor film can be reduced. Alternatively, the light exposure method is not limited to the electron beam exposure, and liquid immersion exposure in which ArF excimer laser light is used as a light source or extreme ultraviolet (EUV) exposure may be used.

When the organic coating film is provided between the resist mask and the hard mask as described above, the adhesion between the resist mask and the organic coating film can be improved. In the case where the adhesion between the resist mask and the hard mask is sufficient, the organic coating film is not necessarily provided. Note that the microfabrication of the oxide semiconductor film is described in detail below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

With the use of the CAAC-OS film in a transistor, variation in electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For example, a CAAC-OS film can be deposited by a sputtering method using a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In that case, the flat-plate-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a film formation gas whose dew point is −80° C. or lower, preferably −100° C. or lower, more preferably −120° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Note that when silicon and carbon are contained in the oxide semiconductor film 104 at a high concentration, the crystallinity of the oxide semiconductor film 104 is lowered in some cases. In order not to lower the crystallinity of the oxide semiconductor film 104, the concentration of silicon in the oxide semiconductor film 104 is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$. Moreover, in order not to lower the crystallinity of the oxide semiconductor film 104, the concentration of carbon in the oxide semiconductor film 104 is set to be lower than $1 \times 10^{19}$ atoms/cm$^3$, preferably lower than $5 \times 10^{18}$ atoms/cm$^3$, further preferably lower than $2 \times 10^{18}$ atoms/cm$^3$.

As described above, in the case where the oxide semiconductor film 104 in which a channel is formed has high crystallinity and the density of states due to an impurity or a defect is low, a transistor including the oxide semiconductor film 104 has stable electrical characteristics.

For the source electrode 106a and the drain electrode 106b, a conductive material which is more likely to be bonded to oxygen than to be bonded to a metal element included in the oxide semiconductor film can be used. For example, Al, Cr, Cu, Ta, Ti, Mo, W, or Ti can be used. W having a high melting point is especially preferred because a relatively high process temperature can be employed in a later step. Note that a conductive material which is likely to be bonded to oxygen includes a material to which oxygen is easily diffused. Alternatively, a plurality of the above materials may be stacked. For example, Cu may be stacked over W.

A material of a conductive film to be the source electrode and the drain electrode is a conductive material which is more likely to be bonded to oxygen than to a metal element included in the oxide semiconductor film; therefore, oxygen in the oxide semiconductor film 104 is bonded to the conductive material. The bonding causes oxygen vacancy in a region of the oxide semiconductor film 104 in the vicinity of an interface with the conductive film. Alternatively, damage (oxygen vacancy) to the top surface of the oxide semiconductor film 104 is caused when the conductive film to be formed over the oxide semiconductor film 104 is formed. Regions whose resistances are reduced owing to the oxygen vacancy and hydrogen, i.e., the low-resistance region 105a and the low-resistance region 105b are formed, so that contact resistance between the oxide semiconductor film and the source electrode or the drain electrode is reduced. Also in the case where the material of the conductive film is a conductive material which is easily diffused into the oxide semiconductor film by heat treatment, the low-resistance region 105a and the low-resistance region 105b are formed.

Therefore, a channel formation region of the transistor 150 corresponds to a region A of the oxide semiconductor film 104 between the low-resistance region 105a and the low-resistance region 105b and regions A1 (not illustrated) which include a region of the low-resistance region 105a which is not in contact with the source electrode 106a and a region of the low-resistance region 105b which is not in contact with the drain electrode 106b. The resistance of the channel formation region of the transistor 150 is reduced (the channel formation region is made to be an n-type); therefore, it is necessary that the impurity concentration of the oxide semiconductor film 104 is reduced so that the oxide semiconductor film is a highly purified to be intrinsic. Obtaining a highly purified intrinsic oxide semiconductor film refers to purifying or substantially purifying the oxide semiconductor film to be an intrinsic or substantially intrinsic oxide semiconductor film. The term "substantially intrinsic" refers to the state where an oxide semiconductor film has a carrier density lower than $1 \times 10^{17}$/cm$^3$, preferably lower than $1 \times 10^{15}$/cm$^3$, further preferably lower than $1 \times 10^{13}$/cm$^3$.

In order that the channel formation region of the transistor 150 is a highly purified to be intrinsic, oxygen is added to the region A and the regions A1 of the oxide semiconductor film 104. The addition of oxygen can reduces the amount of oxygen vacancy, so that a highly purified intrinsic region can be formed. Accordingly, the highly purified intrinsic region and the low resistance regions can be formed in a self-aligned manner.

Further, excess oxygen can be easily released from the base insulating film 102 and the insulating film 112 by heat treatment, so that the oxygen vacancy in the oxide semiconductor film 104 can be reduced. Thus, the amount of oxygen vacancy in the channel formation region of the oxide semiconductor film 104 is further reduced, so that the channel formation region is a highly purified intrinsic region.

The gate insulating film 108 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

A silicon oxide film can be used for the gate insulating film 108, for example. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide film, a silicon oxide film containing excess oxygen is preferably used.

For the gate electrode 110, a conductive film formed using Al, Ti, Cr, Co, Ni, Cu, Y, Zr, Mo, Ru, Ag, Ta, W, or the like can be used. The gate electrode 110 may be a stacked layer of any of the above materials.

The gate insulating film 112 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 112 may be, for example, a stacked film including a silicon oxide film as a first layer and a silicon nitride film as a second layer. In this case, the silicon oxide film may be a silicon oxynitride film. The silicon nitride film may be a silicon nitride oxide film. It is preferable to use a silicon oxide film whose defect density is small as the silicon oxide film. Specifically, a silicon oxide film whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride film, a silicon nitride film from which a hydrogen gas and an ammonia gas are less likely to be released is used. The amount of released hydrogen gas or ammonia gas may be measured by thermal desorption spectroscopy (TDS). Further, as the silicon nitride film, a silicon nitride film which does not transmit or hardly transmits hydrogen, water, and oxygen is used.

The insulating film 112 may be, for example, a stacked film including a first silicon oxide film as a first layer, a second silicon oxide film as a second layer, and a silicon nitride film as a third layer. In this case, one of or both the first silicon oxide film and the second silicon oxide film may be a silicon oxynitride film. The silicon nitride film may be a silicon nitride oxide film. It is preferable to use a silicon oxide film whose defect density is small as the first silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film from which a hydrogen gas and an ammonia gas are less likely to be released is used. The amount of released hydrogen gas or ammonia gas may be measured by TDS. Further, as the silicon nitride film, a silicon nitride film which does not transmit or hardly transmits hydrogen, water, and oxygen is used.

In the case where at least one of the gate insulating film 108 and the insulating film 112 includes an insulating film containing excess oxygen, oxygen vacancies in the oxide semiconductor film 104 are reduced, so that stable electrical characteristics of a transistor can be achieved.

Next, a method for manufacturing the transistor 150 is described with reference to FIGS. 2A to 2D and FIGS. 3A to 3D.

First, the substrate 100 is prepared.

Next, the base insulating film 102 is formed over the substrate 100. Then, an oxide semiconductor film 103 is deposited over the base insulating film 102 (see FIG. 2A). The base insulating film has a function of suppressing entry of impurities from the substrate 100 side. The base insulating film can be formed by a plasma CVD (chemical vapor deposition) method, a sputtering method, or the like.

The oxide semiconductor film 103 may be deposited by a sputtering method, a CVD method, an MBE method, an ALD method, or a PLD method.

In the case where the oxide semiconductor film 103 is formed by a sputtering method, a power supply device for generating plasma can be an RF power supply device, an AC power supply device, a DC power supply device, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film 103.

In the case of using a sputtering method, at least the oxide semiconductor film 103 can become a CAAC-OS film by the following method. Specifically, the oxide semiconductor film 103 is formed while the substrate is heated at a temperature higher than or equal to 150° C. and lower than or equal to 500° C., preferably higher than or equal to 150° C. and lower than or equal to 450° C., more preferably higher than or equal to 200° C. and lower than or equal to 350° C.

Subsequently, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, or more preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, or more preferably 10% or more in order to compensate desorbed oxygen. The first heat treatment enables the crystallinity of the oxide semiconductor film 103 to be improved, and in addition, impurities such as water, hydrogen, nitrogen, and carbon to be removed from the oxide semiconductor film.

Next, a hard mask 120 is deposited over the oxide semiconductor film 103, an organic coating film 122 is deposited over the hard mask 120, and a resist is formed over the organic coating film 122. Then, the resist is exposed to an electron beam, so that a resist mask 124 is formed (see FIG. 2B).

The hard mask 120 may be a single layer or a stacked layer of a simple substance selected from Ti, Mo, Ta, and W; a nitride containing one or more kinds of the above substances; or an alloy containing one or more kinds of the above substances. Alternatively, an oxide insulating film which is formed using silicon oxide or the like or a nitride insulating film which is formed using silicon nitride or the like may be used. Alternatively, an oxide or an oxynitride which contains at least In and Zn may be used. For example, an In—Ga—Zn—O—N-based material may be used.

When the organic coating film 122 is provided between the resist mask 124 and the hard mask 120 as described above, the adhesion between the resist mask 124 and the organic coating film 122 can be improved. In the case where the adhesion between the resist mask 124 and the hard mask 120 is sufficient, the organic coating film 122 is not necessarily provided; however, when the organic coating film 122 is provided, the adhesion between the hard mask 120 and the organic coating film 122 and the adhesion between the organic coating film 122 and the resist can be improved, leading to improvements in productivity and reliability.

As the organic coating film 122, a bottom anti-reflective coating (BARC) film such as SWK-T7 (manufactured by TOKYO OHKA KOGYO CO., LTD), an adhesion promoter such as AZ AD Promoter (manufactured by AZ ELECTRONIC MATERIALS), or the like can be used.

In an electron beam lithography apparatus capable of electron beam irradiation, the acceleration voltage is preferably in the range from 5 kV to 50 kV, for example. The current intensity is preferably greater than or equal to $5 \times 10^{-12}$ A and less than or equal to $1 \times 10^{-11}$ A. The minimum beam size is preferably 2 nm or less. The minimum possible pattern line width is preferably 8 nm or less.

Under the above conditions, the resist mask 124 with a width of, for example, 1 nm or more and 30 nm or less, preferably 20 nm or less, more preferably 8 nm or less, can be obtained.

For the exposure to an electron beam, it is preferable that the resist be as thin as possible so that the resist mask 124 has a minute line width. When the resist is thin, a surface on which the resist is formed is preferably as flat as possible. In the method for manufacturing the semiconductor device of this embodiment, the unevenness due to the base insulating film 102 and the like can be reduced by planarization treatment such as a polishing treatment (i.e. CMP treatment), etching (dry etching or wet etching) treatment, plasma treatment, or the like of the base insulating film 102 and the like; thus, the resist mask can be thin. This facilitates the exposure to an electron beam.

The channel length of the transistor 150 is preferably equal in any part of the transistor. In the case where the shape of the channel formation region of the transistor includes a curved line, it is preferable to form the curved line by exposure to an electron beam so as to be smooth and so as to have an equal the line width. Note that a channel length refers to a distance between a source electrode and a drain electrode of a transistor.

In order to form a smooth curved line with an equal line width by exposure to an electron beam, there is a method for exposure of a curved line by rotating a stage overlapping with a substrate thereon, for example. With a linearly movable stage, a resist mask can also be patterned so that the channel length of the transistor becomes equal, by using a method in which the size or direction of a figure for dividing electron beam writing regions is optimized in accordance with the pattern of the electron beam, a multi-pass writing method in which a figure is shifted by a uniform width and writing is performed with an overlap so that the amount of light exposure of a pattern becomes equal, or the like. It is preferable to use the above method or the like to form a resist mask with an equal line width so that the channel length of the transistor 150 becomes equal.

Alternatively, liquid immersion exposure in which ArF excimer laser light is used as a light source or EUV exposure may be used for the light exposure. Here, the liquid immersion exposure in which ArF excimer laser light is used as a light source is described with reference to FIG. 15 and FIG. 16.

The resolution of a light exposure apparatus is described. The line width of exposure light is expressed by the following formula (Rayleigh's formula).

$$R = k \cdot \frac{\lambda}{NA} \quad \text{[Formula 1]}$$

Here, R is a line width of the exposure light, k is a proportional constant which depends on a resist material and a light exposure method, λ is a wavelength of the exposure light, and NA is brightness (numerical aperture) of the projection lens. Note that NA is expressed by the following formula.

$$NA = n \cdot \sin \theta \quad \text{[Formula 2]}$$

Figure 16:
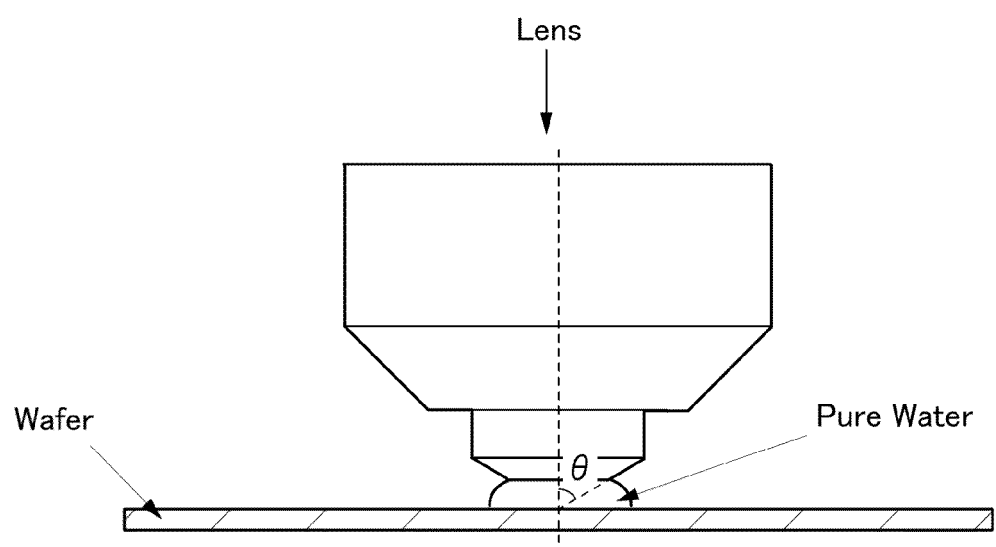
FIG. 16 illustrates an aperture angle of a lens.

Here, n is a refractive index between the lens and the resist; θ is an aperture angle of the lens shown in FIG. 16.

Figure 15:
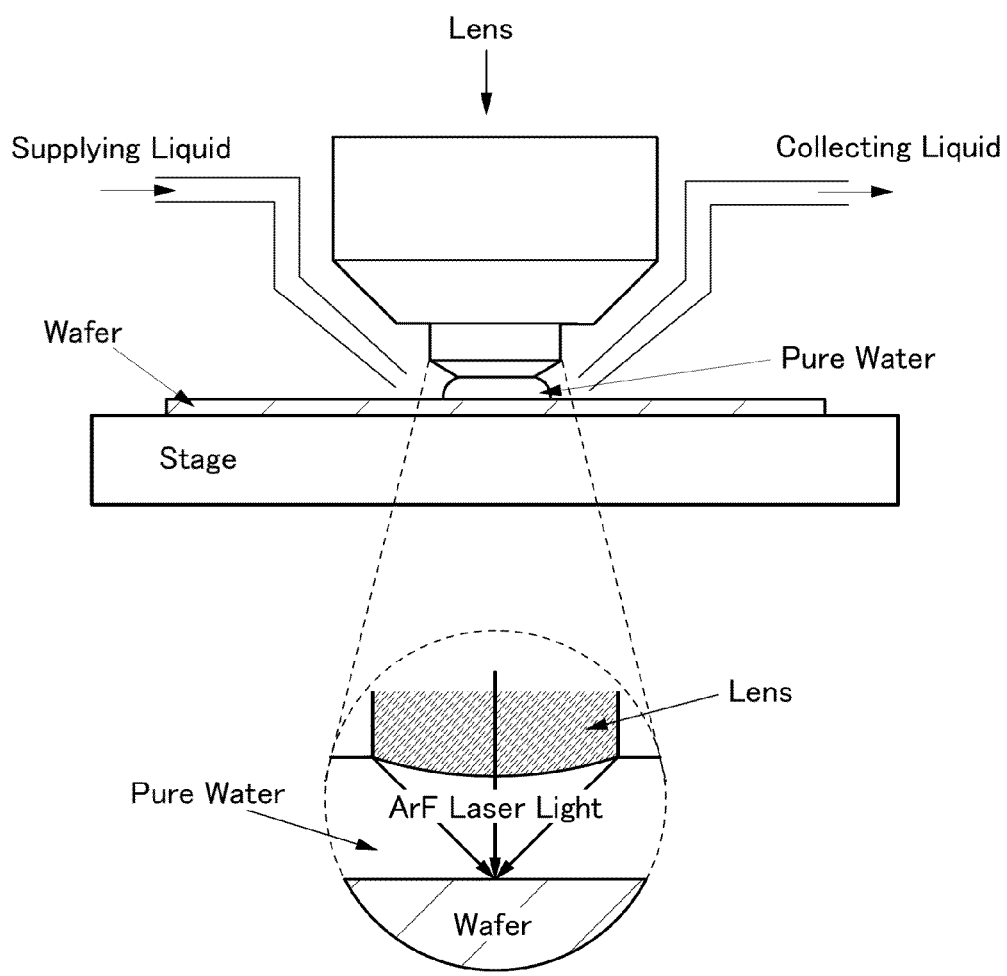
FIG. 15 illustrates a liquid immersion exposure apparatus.

In order to obtain high resolution by a reduction in the line width R of the exposure light, it is necessary to reduce the wavelength of a light source or to increase NA. Here, in order to increase NA, a space between the projection lens of the light exposure apparatus and a wafer is filled with liquid (pure water: n=1.44) as illustrated in FIG. 15.

When a space between the projection lens and the wafer is filled with the liquid (pure water), the refractive index n of a medium disposed between the lens and the resist is increased and NA is increased accordingly; thus, the line width R of the exposure light is reduced, whereby the resolution can be increased.

Note that when NA is too large, the exposure light exceeds a critical angle and total reflection occurs at an interface with the lens. The critical angle is expressed by the following formula.

$$CA = \sin^{-1}\left(\frac{n2}{n1}\right) \quad \text{[Formula 3]}$$

Here, CA is a critical angle, n1 is a refractive index of a medium disposed on the side from which light is emitted and an incident side, and n2 is a refractive index of a medium disposed on the side to which the light is emitted.

For example, when n1 is 1.5 and there is nothing between the projection lens and the wafer (only air: n=1.0), the critical angle is 42°; however, in the case of using a liquid immersion technique (where pure water is used), the critical angle is 73°. Therefore, with the use of the liquid immersion technique, the angle at which light can enter a medium can be broadened and NA can be increased.

Figure 2A:
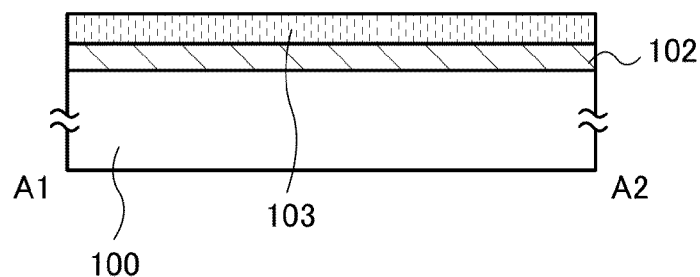
FIGS. 2A to 2D are cross-sectional views illustrating a method for manufacturing a semiconductor device of one embodiment of the present invention.
Figure 2B:
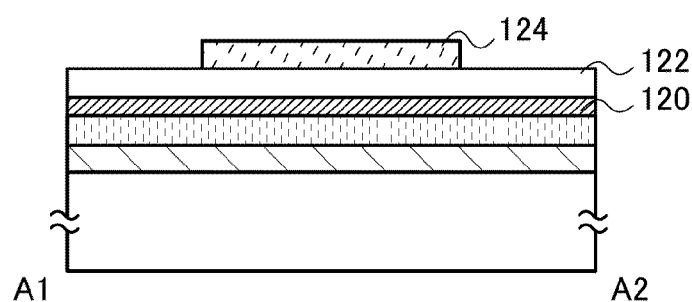
Figure 2C:
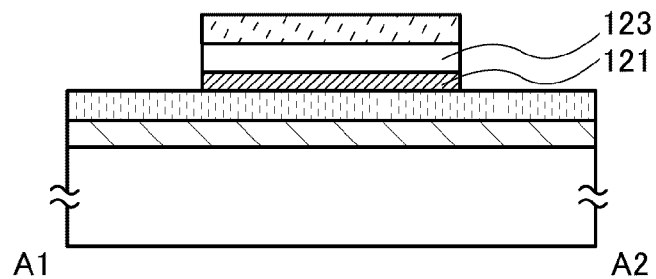

Next, the organic coating film 122 and the hard mask 120 are selectively etched using the resist mask 124 as a mask, so that an organic coating film 123 and a hard mask 121 are formed (see FIG. 2C).

Note that for the hard mask 121, a hard mask which has a high etching selection ratio with respect to the resist mask 124 and with which a pattern of the resist mask 124 can be easily formed even if the resist mask 124 is thin is preferably used. Further, it is preferable that the hard mask 121 be not easily etched under conditions where the oxide semiconductor film 103 is etched, because the hard mask 121 is used as a mask when the oxide semiconductor film 103 is etched.

Figure 2D:
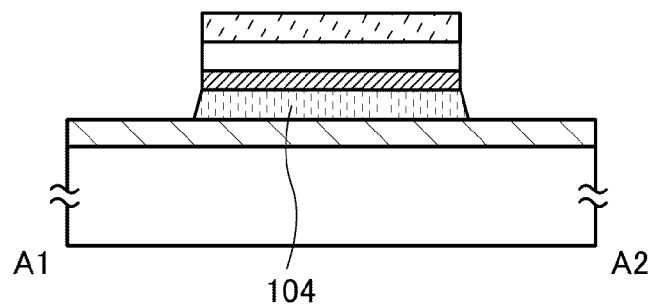

Next, the oxide semiconductor film 103 is selectively etched with the use of the resist mask 124 and the hard mask 121 as masks, so that the oxide semiconductor film 104 is formed (see FIG. 2D).

Figure 3A:
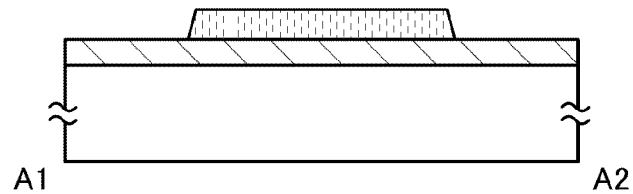
FIGS. 3A to 3D are cross-sectional views illustrating a method for manufacturing a semiconductor device of one embodiment of the present invention.

Then, the hard mask 121, the organic coating film 123, and the resist mask 124 over the oxide semiconductor film 104 are removed (see FIG. 3A). There is no particular limitation on the removal treatment; for example, etching, ashing using oxygen plasma, or the like may be performed.

Alternatively, the following process may be employed. Before the oxide semiconductor film 103 is etched, the organic coating film 123 and the resist mask 124 are removed by ashing using oxygen plasma. After that, the oxide semiconductor film 104 is formed by etching the oxide semiconductor film 103 and then the hard mask 121 is removed.

Figure 3B:
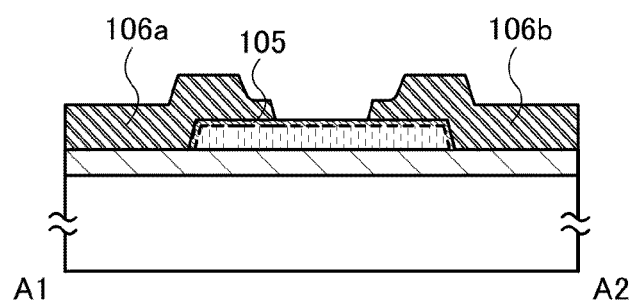

Next, a conductive film to be the source electrode 106a and the drain electrode 106b is deposited over the base insulating film 102 and the oxide semiconductor film 104 and then part of the conductive film is processed to form the source electrode 106a and the drain electrode 106b (see FIG. 3B). The edge portions of the source electrode 106a and the drain electrode 106b are formed to have a step as shown in the drawings. The edge portions can be formed in such a manner that a step of making a resist mask reduce by ashing and an etching step are alternately performed a plurality of times. The conductive film may be deposited by a sputtering method, a CVD method, an MBE method, an ALD method, or a PLD method using the material of the source electrode 106a and the drain electrode 106b described above.

For a conductive film to be the source electrode 106a and the drain electrode 106b, a conductive material which is more likely to be bonded to oxygen than to be bonded to a metal element included in the oxide semiconductor film is used. A material of the conductive film is a conductive material which is likely to be bonded to oxygen; therefore, oxygen in the oxide semiconductor film 104 is bonded to the conductive material (the conductive film). The bonding causes oxygen vacancy in a region of the oxide semiconductor film 104 in the vicinity of an interface with the conductive film. Alternatively, damage (oxygen vacancy) to the top surface of the oxide semiconductor film 104 is caused when the conductive film to be formed over the oxide semiconductor film 104 is formed. By the oxygen vacancy, a low-resistance region 105 is formed. In this embodiment, the low-resistance region 105 exists in a region at a depth of greater than 0 nm and less than or equal to 15 nm, preferably less than 10 nm, further preferably less than 3 nm from the interface between the oxide semiconductor film 104 and the conductive film in the depth direction of the oxide semiconductor film 104.

When the low-resistance region 105 is formed, contact resistance between the source electrode or the drain electrode to be formed later and the oxide semiconductor film 104 can be reduced, so that high-speed operation of the transistor 150 can be achieved.

Further, the step of making the resist mask reduce by ashing and the etching step are alternately performed, whereby the edge portions of the source electrode 106a and the drain electrode 106b are provided over the low-resistance region 105a and the low-resistance region 105b to be formed later.

Therefore, the channel formation region of the transistor 150 corresponds to a region B of the low-resistance region 105 which is not in contact with the source electrode 106a and the drain electrode 106b. That is, the channel formation region consists of the region A of the oxide semiconductor film and the regions A1. The channel formation region of the transistor 150 is made to be an n-type; therefore, it is necessary that the impurity concentration of the oxide semiconductor film 104 is reduced so that the oxide semiconductor film is a highly purified to be intrinsic.

Figure 3C:
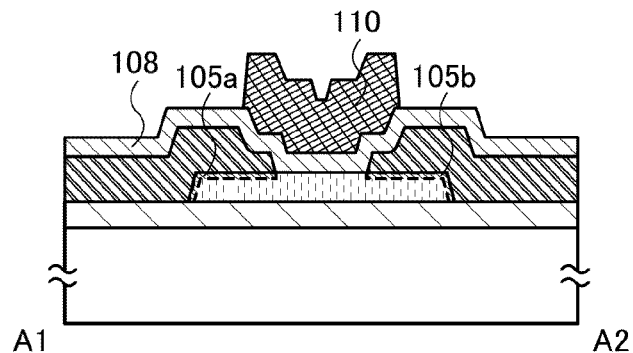

Next, the gate insulating film 108 is formed (see FIG. 3C). The gate insulating film 108 may be formed by a sputtering method, a CVD method, an MBE method, an ALD method, or a PLD method using a material of the gate insulating film 108 described above.

Next, oxygen is added to the region B which is to be the channel formation region of the oxide semiconductor film, so that the low-resistance region 105a and the low-resistance region 105b are formed.

Oxygen can be added to the region B of the oxide semiconductor film by an ion doping method or an ion implantation method. Alternatively, as a method for adding oxygen, a plasma immersion ion implantation method may be used.

Alternatively, oxygen can be added by a method other than an ion doping method, an ion implantation method, or the like. For example, oxygen can be added in such a manner that plasma is generated in an oxygen atmosphere and then the region B is subjected to plasma treatment in the oxygen atmosphere. As an apparatus for generating plasma, a dry etching apparatus, a plasma CVD apparatus, a high-density plasma CVD apparatus, or the like can be used.

At least one of an oxygen radical, an oxygen atom, and an oxygen ion is added to the region B of the oxide semiconductor film as the oxygen. Further, the oxygen may be added to at least part of the region B, typically any of a surface of the region B of the oxide semiconductor film, an inner part of the region B of the oxide semiconductor film, and the interface between the region B of the oxide semiconductor film and the base insulating film 102.

In the case where oxygen is added to the region B of the oxide semiconductor film by an ion doping method or an ion implantation method, the amount of oxygen added to the region B of the oxide semiconductor film is larger than or equal to $5\times10^{19}/cm^3$ and smaller than or equal to $5\times10^{21}/cm^3$. In this case, when the oxygen has high energy, the region B of the oxide semiconductor film is damaged and physical defects are caused. Therefore, the oxygen preferably has such energy which does not cause damage on the oxide semiconductor film. The region B of the oxide semiconductor film includes a region in which an oxygen content increases from the surface toward the depth direction of the oxide semiconductor film.

The whole low-resistance region 105a does not necessarily overlap with the source electrode and may include a region which extends to the low-resistance region 105b side and does not overlap with the source electrode. Further, the whole low-resistance region 105b does not necessarily overlap with the drain electrode and may include a region which extends to the low-resistance region 105a side and does not overlap with the drain electrode. The low-resistance region 105a and the low-resistance region 105b do not necessarily have uniform thickness. For example, the end portion of the low-resistance region 105a which does not overlap with the source electrode may gently spread from the bottom surface toward the surface of the low-resistance region 105a. In a similar manner, for example, the end portion of the low-resistance region 105b which does not overlap with the drain electrode may gently spread from the bottom surface toward the surface of the low-resistance region 105b. A difference between the length between the source electrode 106a and the drain electrode 106b and the length between the low-resistance region 105a and the low-resistance region 105b is less than 30%, preferably less than 10%, further preferably less than 3% of the length between the source electrode 106a and the drain electrode 106b.

Next, second heat treatment is preferably performed. The second heat treatment can be performed in a similar condition to the first heat treatment. By the second heat treatment, impurities such as hydrogen and water can be further removed from the oxide semiconductor film 104.

Next, a conductive film to be the gate electrode 110 is deposited over the gate insulating film 108 and then part of the conductive film is processed to form the gate electrode 110. The conductive film may be deposited by a sputtering method, a CVD method, an MBE method, an ALD method, or a PLD method using a material of the gate electrode 110 described above.

Figure 3D:
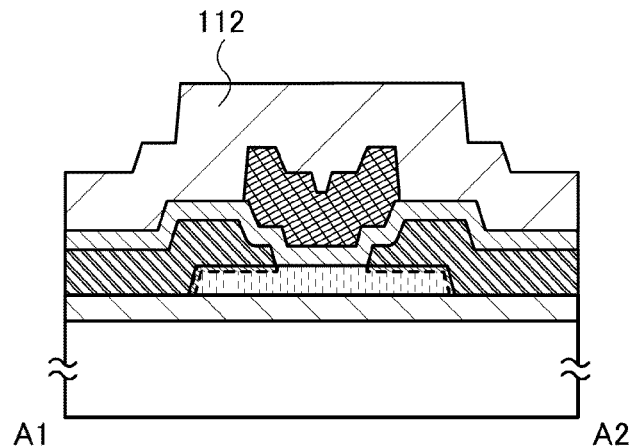

Next, the insulating film 112 is formed over the source electrode 106a, the drain electrode 106b, and the gate electrode 110 (see FIG. 3D). The insulating film 112 can be formed by a plasma CVD method, a sputtering method, or the like.

Next, third heat treatment is preferably performed. The third heat treatment can be performed in a similar condition to the first heat treatment. In the case where the base insulating film 102 and the insulating film 112 contain excess oxygen, the excess oxygen is easily released from the base insulating film 102 and the insulating film 112 by the third heat treatment, so that oxygen vacancy in the oxide semiconductor film 104 can be reduced. Accordingly, the amount of oxygen vacancy in the channel formation region of the oxide semiconductor film 104 can be further reduced, so that the channel formation region becomes a highly purified intrinsic region.

In this manner, the transistor 150 can be manufactured.

By such a manufacturing method, when the oxide semiconductor film is microfabricated to have an island shape, unevenness of an end portion of the oxide semiconductor film can be suppressed. Accordingly, a miniaturized transistor having high electrical characteristics can be provided in a high yield. Further, also in a semiconductor device including the transistor, high performance, high reliability, and high productivity can be achieved.

This embodiment can be combined with any of the other embodiments in this specification as appropriate.

Embodiment 2

In this embodiment, a transistor having a structure different from that of the transistor described in Embodiment 1 is described.

Figure 4A:
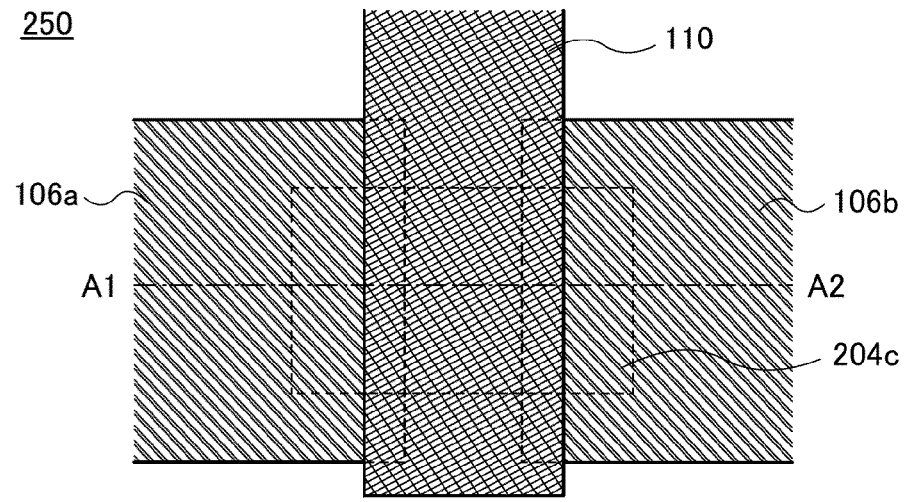
FIGS. 4A to 4C are a plan view and cross-sectional views illustrating a semiconductor device of one embodiment of the present invention.
Figure 4B:
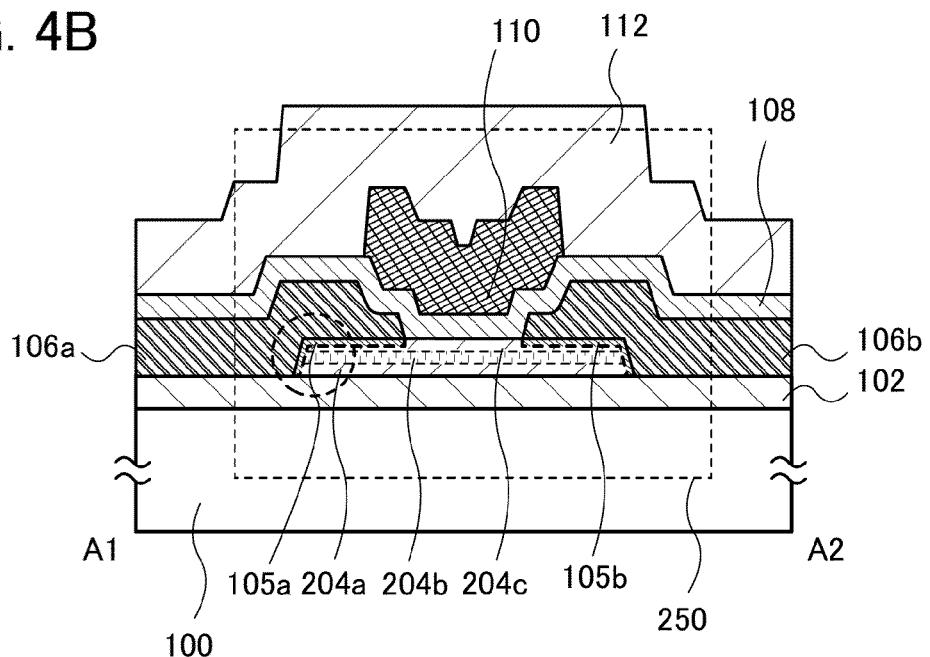
Figure 4C:
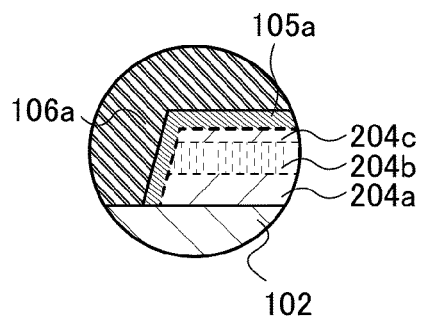

FIGS. 4A to 4C are a top view and cross-sectional views of a transistor 250 of one embodiment of the present invention. FIG. 4A is the top view, and a cross section taken along a dashed-dotted line A1-A2 in FIG. 4A is illustrated in FIG. 4B. FIG. 4C is an enlarged view of a region surrounded by a dashed-line circle in FIG. 4B. Note that for simplification of the drawing, some components in the top view in FIG. 4A are not illustrated.

The transistor 250 illustrated in FIGS. 4A to 4C includes a base insulating film 102 over a substrate 100, an oxide film 204a over the base insulating film 102, an oxide semiconductor film 204b over the oxide film 204a, an oxide film 204c over the oxide semiconductor film 204b, a source electrode 106a and a drain electrode 106b which are in contact with the oxide film 204c, a gate insulating film 108 over the oxide film 204c, the source electrode 106a, and the drain electrode 106b, and a gate electrode 110 over the gate insulating film 108. In addition, an insulating film 112 may be provided over the gate insulating film 108 and the gate electrode 110. Note that the insulating film 112 is provided as needed and another insulating film may be further provided thereover.

Depending on materials used for the oxide film 204a, the oxide semiconductor film 204b, and the oxide film 204c, boundaries between the oxide film 204a and the oxide semiconductor film 204b and between the oxide semiconductor film 204b and the oxide film 204c cannot be clearly recognized in some cases. Thus, the boundaries of the oxide film 204a, the oxide semiconductor film 204b, and the oxide film 204c are denoted by dotted lines in the drawings.

The transistor 250 illustrated in FIGS. 4A to 4C is different from the transistor 150 described in Embodiment 1 in that the oxide films are provided over and under the oxide semiconductor film. Embodiment 1 can be referred to for the other structures.

The oxide film 204a, the oxide semiconductor film 204b, and the oxide film 204c each contain one or both of In and Ga. Typical examples include an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd, and Hf).

The oxide film 204a and the oxide film 204c are preferably formed using a material including one or more kinds of metal elements included in the oxide semiconductor film 204b. With the use of such a material, an interface state at interfaces between the oxide semiconductor film 204b and each of the oxide films 204a and 204c is less likely to be generated. Thus, scattering of carriers or capture of carriers at the interface does not easily occur, so that the field-effect mobility of the transistor can be improved. Further, variation in threshold voltage of the transistor can be reduced. Note that the oxide film 204a, the oxide semiconductor film 204b, and the oxide film 204c are collectively referred to as a multilayer film, in some cases.

Further, it is preferable that each of the oxide film 204a and the oxide film 204c be formed using an oxide semiconductor whose energy of the bottom of the conduction band is closer to the vacuum level than that of the oxide semiconductor film 204b by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode 110 in such a structure, a channel is formed in the oxide semiconductor film 204b of the multilayer film, because the oxide semiconductor film 204b has low energy at the bottom of the conduction band. In other words, the oxide film 204c is formed between the oxide semiconductor film 204b and the gate insulating film 108, whereby a structure in which the channel of the transistor is not in contact with the gate insulating film can be obtained.

Depending on materials used for the oxide film 204a, the oxide semiconductor film 204b, and the oxide film 204c, boundaries between the oxide film 204a and the oxide semiconductor film 204b and between the oxide semiconductor film 204b and the oxide film 204c cannot be clearly recognized in some cases. Therefore, in the drawings, the oxide semiconductor film 204b is indicated using a different hatching pattern from those of the oxide film 204a and the oxide film 204c.

The thickness of the oxide film 204a is greater than or equal to 3 nm and less than or equal to 50 nm, preferably greater than or equal to 3 nm and less than or equal to 20 nm. The thickness of the oxide semiconductor film 204b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide film 204c is greater than or equal to 3 nm and less than or equal to 100 nm, preferably greater than or equal to 3 nm and less than or equal to 50 nm.

When each of the oxide semiconductor film 204b and the oxide film 204a is an In-M-Zn oxide and the oxide film 204a and the oxide semiconductor film 204b contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element which has a higher ability than In to bind to oxygen, examples of which include Al, Ti, Ga, Y, Zr, Sn, La, Ce, Nd, Hf, and the like. Preferably, the oxide semiconductor film 204b and the oxide film 204a in which $y_1/x_1$ is 1.5 times or more as large as $y_2/x_2$ are selected. More preferably, the oxide semiconductor film 204b and the oxide film 204a in which $y_1/x_1$ is twice or more as large as $y_2/x_2$ are selected. Still further preferably, the oxide semiconductor film 204b and the oxide film 204a in which $y_1/x_1$ is three times or more as large as $y_2/x_2$ are selected. At this time, $y_1$ is preferably greater than or equal to $x_1$ in the oxide semiconductor film 204b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide film 204a has the above structure, the oxide film 204a can be a film in which oxygen vacancies are less likely to occur than in the oxide semiconductor film 204b.

When the oxide semiconductor film 204b is an In-M-Zn oxide, it is preferable that without taking Zn and O into consideration, the proportion of In be greater than or equal to 25 atomic % and the proportion of M be less than 75 atomic %, and it is more preferable that the proportion of In be greater than or equal to 34 atomic % and the proportion of M be less than 66 atomic %. When the oxide film 204a is an In-M-Zn oxide, it is preferable that without taking Zn and O into consideration, the proportion of In be less than 50 atomic % and the proportion of M be greater than or equal to 50 atomic %, and it is more preferable that the proportion of In be less than 25 atomic % and the proportion of M be greater than or equal to 75 atomic %.

For example, as the oxide semiconductor film 204b, an In—Ga—Zn oxide in which an atomic ratio of In to Ga and Zn is 1:1:1 or 3:1:2 can be used. As the oxide film 204a, an In—Ga—Zn oxide in which an atomic ratio of In to Ga and Zn is 1:3:4, 1:3:2, 1:6:2, 1:6:4, 1:6:10, 1:9:6, or 1:9:0 can be used. Note that the atomic ratio of each of the oxide semiconductor film 204b and the oxide film 204a may vary within a margin of ±20% of the corresponding atomic ratio.

Likewise, when each of the oxide semiconductor film 204b and the oxide film 204c is an In-M-Zn oxide and the oxide film 204c and the oxide semiconductor film 204b contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element which has a higher ability than In to bind to oxygen, examples of which include Al, Ti, Ga, Y, Zr, Sn, La, Ce, Nd, Hf, and the like. Preferably, the oxide semiconductor film 204b and the oxide film 204c in which $y_1/x_1$ is 1.5 times or more as large as $y_2/x_2$ are selected. More preferably, the oxide semiconductor film 204b and the oxide film 204c in which $y_1/x_1$ is twice or more as large as $y_2/x_2$ are selected. Still further preferably, the oxide semiconductor film 204b and the oxide film 204c in which $y_1/x_1$ is three times or more as large as $y_2/x_2$ are selected. At this time, $y_1$ is preferably greater than or equal to $x_1$ in the oxide semiconductor film 204b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide film 204c has the above structure, the oxide film 204c can be a film in which oxygen vacancies are less likely to occur than in the oxide semiconductor film 204b.

When the oxide semiconductor film 204b is an In-M-Zn oxide, it is preferable that without taking Zn and O into consideration, the proportion of In be greater than or equal to 25 atomic % and the proportion of M be less than 75 atomic %, and it is more preferable that the proportion of In be greater than or equal to 34 atomic % and the proportion of M be less than 66 atomic %. When the oxide film 204c is an In-M-Zn oxide, it is preferable that without taking Zn and O into consideration, the proportion of In be less than 50 atomic % and the proportion of M be greater than or equal to 50 atomic %, and it is more preferable that the proportion of In be less than 25 atomic % and the proportion of M be greater than or equal to 75 atomic %.

For example, as the oxide semiconductor film 204b, an In—Ga—Zn oxide in which an atomic ratio of In to Ga and Zn is 1:1:1 or 3:1:2 can be used. As the oxide film 204c, an In—Ga—Zn oxide in which an atomic ratio of In to Ga and Zn is 1:3:4, 1:3:2, 1:6:2, 1:6:4, 1:6:10, 1:9:6, or 1:9:0 can be used. Note that the atomic ratio of each of the oxide semiconductor film 204b and the oxide film 204c may vary within a margin of ±20% of the corresponding atomic ratio.

In order to give stable electrical characteristics to the transistor including the multilayer film, it is preferable that the oxygen vacancies and the impurity concentration in the oxide semiconductor film 204b be reduced and the oxide semiconductor film 204b be an intrinsic or substantially intrinsic semiconductor film. In particular, the channel formation region in the oxide semiconductor film 204b is preferably regarded as intrinsic or substantially intrinsic. Specifically, the carrier density of the oxide semiconductor film 204b is smaller than $1 \times 10^{17}/cm^3$, smaller than $1 \times 10^{15}/cm^3$, or smaller than $1 \times 10^{13}/cm^3$.

Further, in the oxide semiconductor film 204b, hydrogen, nitrogen, carbon, silicon, and a metal element other than main components are impurities. In order to reduce the concentration of impurities in the oxide semiconductor film 204b, it is also preferable to reduce the concentration of impurities in the oxide film 204a and the oxide film 204c which are close to the oxide semiconductor film 204b, to a value almost equal to that in the oxide semiconductor film 204b.

In particular, when silicon is contained in the oxide semiconductor film 204b at a high concentration, an impurity level caused by silicon is formed in the oxide semiconductor film 204b. The impurity level serves as a trap level, and may degrade electrical characteristics of a transistor. In order to reduce degradation of electrical characteristics of the transistor, the silicon concentration of the oxide semiconductor film 204b is smaller than $1 \times 10^{19}$ atoms/$cm^3$, preferably smaller than $5 \times 10^{18}$ atoms/$cm^3$, more preferably smaller than $1 \times 10^{18}$ atoms/$cm^3$. Further, the concentration of silicon at an interface between the oxide semiconductor film 204b and each of the oxide films 204a and 204c is also in the above range.

Note that as the gate insulating film of the transistor, an insulating film containing silicon is used in many cases; therefore, it is preferable that a region of the oxide semiconductor film, which serves as a channel, be not in contact with the insulating film for the above-described reason. In the case where a channel is formed at the interface between a gate insulating film and an oxide semiconductor film, scattering of carriers occurs at the interface, whereby the field-effect mobility of a transistor is reduced in some cases. Also from the view of the above, it is preferable that a region of the oxide semiconductor film, which serves as a channel, be separated from the gate insulating film.

Therefore, when the multilayer film has the stacked-layer structure of the oxide film 204a, the oxide semiconductor film 204b, and the oxide film 204c, the oxide semiconductor film 204b in which a channel of the transistor is formed can be separated from the gate insulating film, so that the transistor can have high field effect mobility and stable electrical characteristics.

Further, in the oxide semiconductor film 204b, hydrogen and nitrogen generate a donor level, and increase the carrier density. In order to make the oxide semiconductor film 204b intrinsic or substantially intrinsic, the concentration of hydrogen in the oxide semiconductor film 204b, which is measured by SIMS, is set to be lower than or equal to $2 \times 10^{20}$ atoms/$cm^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide semiconductor film 204*b*, which is measured by SIMS, is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when silicon and carbon are contained in the oxide semiconductor film 204*b* at a high concentration, the crystallinity of the oxide semiconductor film 204*b* is lowered in some cases. In order not to lower the crystallinity of the oxide semiconductor film 204*b*, the concentration of silicon in the oxide semiconductor film 204*b* is set to be lower than $1\times10^{19}$ atoms/cm$^3$, preferably lower than $5\times10^{18}$ atoms/cm$^3$, more preferably lower than $1\times10^{18}$ atoms/cm$^3$. Moreover, in order not to lower the crystallinity of the oxide semiconductor film 204*b*, the concentration of carbon in the oxide semiconductor film 204*b* is set to be lower than $1\times10^{19}$ atoms/cm$^3$, preferably lower than $5\times10^{18}$ atoms/cm$^3$, more preferably lower than $1\times10^{18}$ atoms/cm$^3$.

Further, since the band gap of an oxide semiconductor is 2 eV or higher, in a transistor including an oxide semiconductor, leakage current when the transistor is off (also referred to as off-state current) is extremely small.

Localized levels of the multilayer film are described below. By reducing the density of the localized state of the multilayer film, the transistor including the multilayer film can have stable electrical characteristics. The density of the localized levels of the multilayer film can be measured by a constant photocurrent method (CPM).

In order that the transistor has stable electrical characteristics, the absorption coefficient due to the localized states of the multilayer film measured by CPM is preferably lower than $1\times10^{-3}$ cm$^{-1}$, more preferably lower than $3\times10^4$ cm$^{-1}$. Further, when the absorption coefficient due to the localized states of the multilayer film measured by CPM is lower than $1\times10^{-3}$ cm$^{-1}$, preferably lower than $3\times10^4$ cm$^{-1}$, the field-effect mobility of the transistor can be increased. In order that the absorption coefficient due to the localized level of the multilayer film measured by CPM is lower than $1\times10^{-3}$ cm$^{-1}$, preferably lower than $3\times10^{-4}$ cm$^{-1}$, the concentration of silicon, germanium, carbon, and the like in the oxide semiconductor film 204*b* which form the localized level is preferably lower than $2\times10^{18}$ atoms/cm$^3$, further preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

The localized levels measured by CPM probably result from an impurity or a defect. In other words, a transistor which includes the multilayer film having a small absorption coefficient due to the localized levels measured by CPM can have stable electrical characteristics.

Next, a method for manufacturing the transistor 250 is described with reference to FIGS. 5A to 5D and FIGS. 6A to 6D.

First, the substrate 100 is prepared. Next, the base insulating film 102 is formed over the substrate 100. Then, an oxide film 203*a*, an oxide semiconductor film 203*b*, and an oxide film 203*c* are deposited in this order over the base insulating film 102 (see FIG. 5A).

Embodiment 1 can be referred to for materials and manufacturing methods of the substrate 100 and the base insulating film 102. The above-described materials can be used for the oxide film 203*a*, the oxide semiconductor film 203*b*, and the oxide film 203*c*; the description of the oxide semiconductor film 103 in Embodiment 1 can be referred to for manufacturing methods of the oxide film 203*a*, the oxide semiconductor film 203*b*, and the oxide film 203*c*.

Subsequently, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, or more preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, or more preferably 10% or more in order to compensate desorbed oxygen. The first heat treatment enables the crystallinity of the multilayer film to be improved, and in addition, impurities such as water, hydrogen, nitrogen, and carbon to be removed from the gate insulating film to be formed later and the multilayer film.

Next, a hard mask 120 is deposited over the oxide film 203*c*, an organic coating film 122 is deposited over the hard mask 120, a resist is formed over the organic coating film 122. Then, the resist is exposed to an electron beam, so that a resist mask 124 is formed (see FIG. 5B).

Alternatively, liquid immersion exposure in which ArF excimer laser light is used as a light source or EUV exposure may be used for the light exposure.

Embodiment 1 can be referred to for materials and manufacturing methods of the hard mask 120, the organic coating film 122, and the resist mask 124.

Figure 5A:
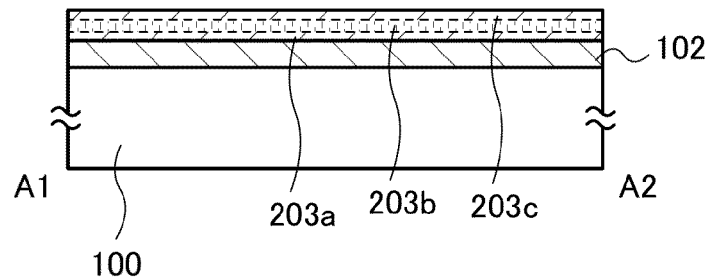
FIGS. 5A to 5D are cross-sectional views illustrating a method for manufacturing a semiconductor device of one embodiment of the present invention.
Figure 5B:
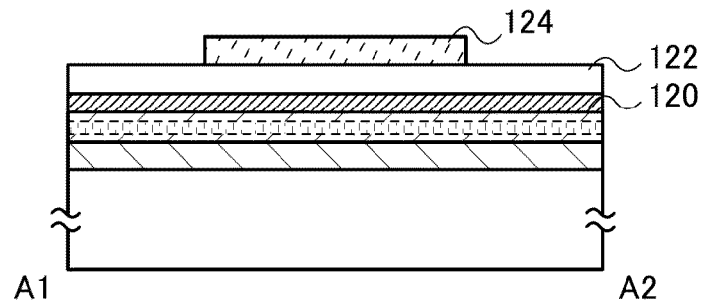
Figure 5C:
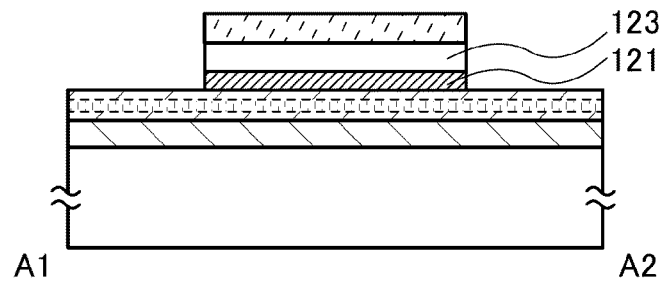

Next, the organic coating film 122 and the hard mask 120 are selectively etched with the use of the resist mask 124 as a mask, so that an organic coating film 123 and a hard mask 121 are formed (see FIG. 5C). Embodiment 1 can be referred to for the etching conditions and the like.

Figure 5D:
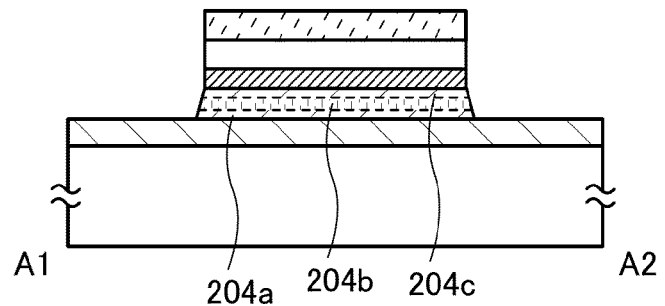

Next, the oxide film 203*a*, the oxide semiconductor film 203*b*, and the oxide film 203*c* are selectively etched with the use of the resist mask 124 and the hard mask 121 as masks, so that an oxide film 204*a*, an oxide semiconductor film 204*b*, and an oxide film 204*c* are formed (see FIG. 5D).

Figure 6A:
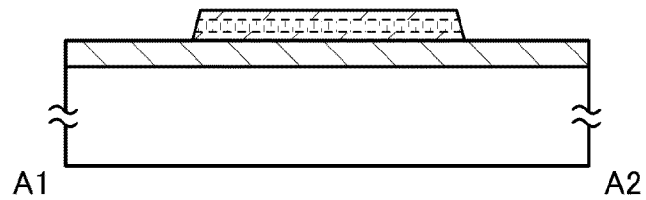
FIGS. 6A to 6D are cross-sectional views illustrating a method for manufacturing a semiconductor device of one embodiment of the present invention.

Then, the hard mask 121, the organic coating film 123, and the resist mask 124 over the oxide film 204*c* are removed (see FIG. 6A). There is no particular limitation on the removal treatment; for example, etching, ashing using oxygen plasma, or the like may be performed.

Alternatively, the following process may be employed. Before the oxide film 203*a*, the oxide semiconductor film 203*b*, and the oxide film 203*c* are etched, the organic coating film 123 and the resist mask 124 are removed by ashing using oxygen plasma. After that, the oxide film 204*a*, the oxide semiconductor film 204*b*, and the oxide film 204*c* are formed by etching the oxide film 203*a*, the oxide semiconductor film 203*b*, and the oxide film 203*c* and then the hard mask 121 is removed.

Figure 6B:
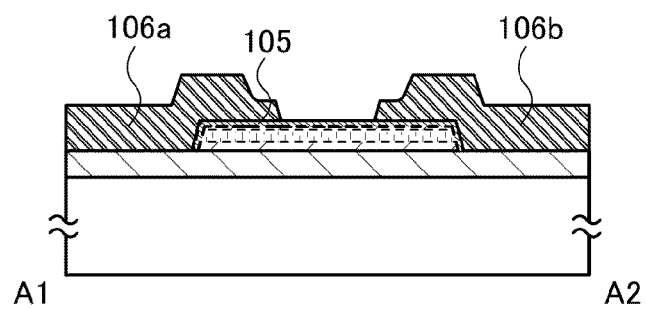

Next, a conductive film to be the source electrode 106a and the drain electrode 106b is deposited over the base insulating film 102 and the oxide film 204c and then part of the conductive film is processed to form the source electrode 106a and the drain electrode 106b (see FIG. 6B). The edge portions of the source electrode 106a and the drain electrode 106b are formed to have a step as shown in the drawings. The edge portions can be formed in such a manner that a step of making a resist mask reduce by ashing and an etching step are alternately performed a plurality of times.

For a conductive film to be the source electrode 106a and the drain electrode 106b, a conductive material which is more likely to be bonded to oxygen than to a metal element included in the multilayer film is used. A material of the conductive film is a conductive material which is likely to be bonded to oxygen; therefore, oxygen in the multilayer film is bonded to the conductive material (the conductive film). The bonding causes oxygen vacancy in a region of the multilayer film in the vicinity of an interface with the conductive film. Alternatively, damage (oxygen vacancy) to the top surface of the multilayer film is caused when the conductive film to be formed over multilayer film is formed. By the oxygen vacancy, a low-resistance region 105 is formed. Although a boundary between the low-resistance region 105 and the multilayer film exists in the oxide film 204c, this embodiment is not limited thereto; the boundary may exist in the oxide film 204a, in the oxide semiconductor film 204b, at the interface between the oxide film 204a and the oxide semiconductor film 204b, or at the interface between the oxide semiconductor film 204b and the oxide film 204c. Further, the low-resistance region 105 exists in a region at a depth of greater than 0 nm and less than or equal to 15 nm, preferably less than 10 nm, further preferably less than 3 nm from the interface between the multilayer film and the conductive film in the depth direction of the multilayer film.

When the low-resistance region 105 is formed, contact resistance between the source electrode or the drain electrode to be formed later and the multilayer film can be reduced, so that high-speed operation of the transistor 250 can be achieved.

Further, the step of making the resist mask reduce by ashing and the etching step are alternately performed, whereby the edge portions of the source electrode 106a and the drain electrode 106b are provided over a low-resistance region 105a and a low-resistance region 105b to be formed later.

Therefore, the channel formation region of the transistor 250 corresponds to a region B of the low-resistance region 105 which is not in contact with the source electrode 106a and the drain electrode 106b. That is, the channel formation region consists of the region A of the multilayer film between the low-resistance region 105a and the low-resistance region 105b and the regions A1. The channel formation region of the transistor 250 is made to be an n-type; therefore, it is necessary that the impurity concentration of the multilayer film is reduced so that the multilayer film is a highly purified to be intrinsic.

Figure 6C:
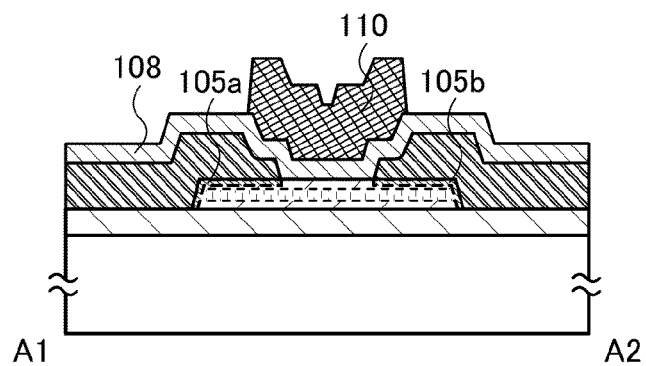

Next, the gate insulating film 108 is formed (see FIG. 6C). Embodiment 1 can be referred to for a material and a manufacturing method of the gate insulating film 108.

Next, oxygen is added to the channel formation region of the multilayer film, so that the low-resistance region 105a and the low-resistance region 105b are formed.

Embodiment 1 can be referred to for a method for adding oxygen to the region B of the multilayer film.

Next, second heat treatment is preferably performed. The second heat treatment can be performed in a similar condition to the first heat treatment. By the second heat treatment, impurities such as hydrogen and water can be further removed from the multilayer film.

Next, a conductive film to be the gate electrode 110 is deposited over the gate insulating film 108 and then part of the conductive film is processed to form the gate electrode 110. Embodiment 1 can be referred to for a material and a manufacturing method of the gate electrode 110.

Figure 6D:
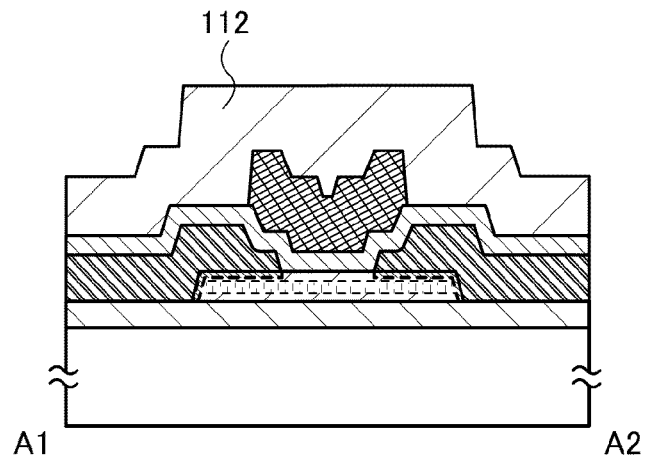

Next, the insulating film 112 is formed over the source electrode 106a, the drain electrode 106b, and the gate electrode 110 (see FIG. 6D). Embodiment 1 can be referred to for a material and a manufacturing method of the insulating film 112.

Next, third heat treatment is preferably performed. The third heat treatment can be performed under a condition similar to that of the first heat treatment. In the case where the base insulating film 102 and the insulating film 112 contain excess oxygen, the excess oxygen is easily released from the base insulating film 102 and the insulating film 112 by the third heat treatment, so that oxygen vacancy in the multilayer film, particularly, the oxide semiconductor film 204b, can be reduced. Accordingly, the amount of oxygen vacancy in the channel formation region of the multilayer film can be further reduced, so that the channel formation region becomes a highly purified intrinsic region.

In this manner, the transistor 250 can be manufactured.

Figure 7:
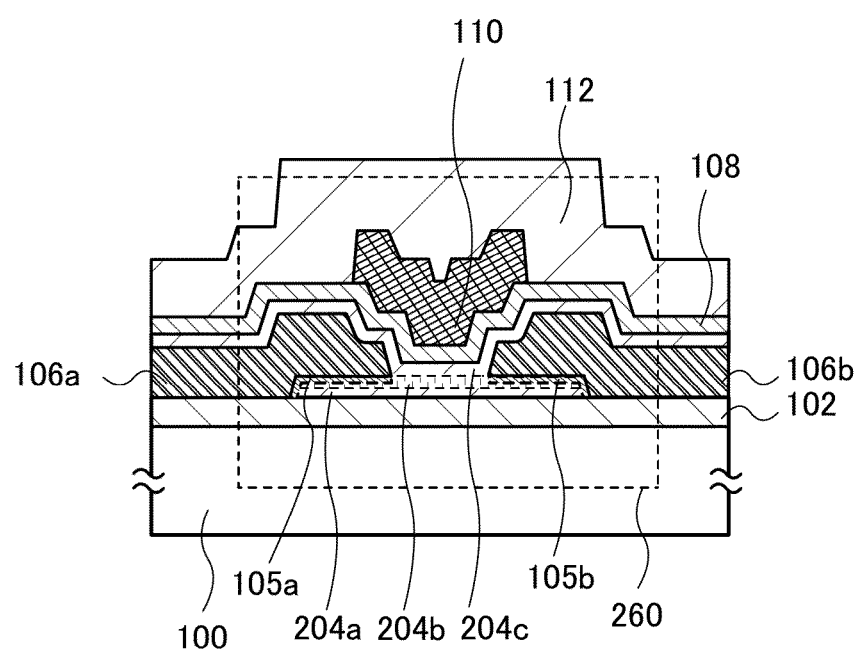
FIG. 7 is a cross-sectional view illustrating a semiconductor device of one embodiment of the present invention.

FIG. 7 illustrates another transistor structure. A transistor 260 illustrated in FIG. 7 includes a base insulating film 102 over a substrate 100, an oxide film 204a over the base insulating film 102, an oxide semiconductor film 204b over the oxide film 204a, an oxide semiconductor film 204b over the oxide film 204a, a source electrode 106a and a drain electrode 106b which are in contact with the oxide semiconductor film 204b, an oxide film 204c over the source electrode 106a and the drain electrode 106b, a low-resistance region 105a which is formed because of extraction of oxygen from the oxide film 204a and the oxide semiconductor film 204b which are in contact with the source electrode 106a, a low-resistance region 105b which is formed because of extraction of oxygen from the oxide film 204a and the oxide semiconductor film 204b which are in contact with the drain electrode 106b, a gate insulating film 108 over the oxide film 204c, the source electrode 106a, and the drain electrode 106b, and a gate electrode 110 over the gate insulating film 108. In addition, an insulating film 112 may be provided over the gate insulating film 108 and the gate electrode 110. Note that the insulating film 112 is provided as needed and another insulating film may be further provided thereover.

The transistor 250 illustrated in FIGS. 4A to 4C is the same as the transistor 260 illustrated in FIG. 7 except that the oxide film 204c is formed over the source electrode 106a and the drain electrode 106b.

In the transistor 260, the oxide semiconductor film 204b in which the channel is formed is in contact with the source electrode 106a and the drain electrode 106b, so that oxygen vacancy is generated at a high density in the oxide semiconductor film 204b and n-type regions (the low-resistance region 105a and the low-resistance region 105b) are formed. Therefore, there is a few resistance components in a carrier path and carriers can be transported efficiently.

Note that in this embodiment, a channel corresponds to a region of the oxide semiconductor film, which is between the source electrode and the drain electrode. Further, a channel formation region corresponds to regions of the oxide film 204a, the oxide semiconductor film 204b, and the oxide film 204c, which are between the source electrode and the drain electrode.

Further, the oxide film 204c is formed after the source electrode 106a and the drain electrode 106b are formed; therefore, overetching of the oxide film 204c does not occur at the time of forming the source electrode 106a and the drain electrode 106b. Therefore, the oxide semiconductor film 204b where the channel is formed can be sufficiently separated from the gate insulating film 108, and the effect of suppressing influence of diffusion of impurities from the interface can be enhanced.

Further, the oxide film 204c functions as a barrier film which suppresses entry of hydrogen or a compound containing hydrogen (e.g., water) from the outside to the oxide semiconductor film 204b; thus, the reliability of the transistor can be improved.

By such a manufacturing method, when the oxide semiconductor film is microfabricated to have an island shape, unevenness of an end portion of the oxide semiconductor film can be suppressed. Accordingly, a miniaturized transistor having high electrical characteristics can be provided in a high yield. Further, also in a semiconductor device including the transistor, high performance, high reliability, and high productivity can be achieved.

This embodiment can be combined with any of the other embodiments in this specification as appropriate.

Embodiment 3

In this embodiment, an example of a semiconductor device (memory device) which includes a transistor of one embodiment of the present invention, which can hold stored data even when not powered, and which has an unlimited number of write cycles is described with reference to drawings.

Figure 8A:
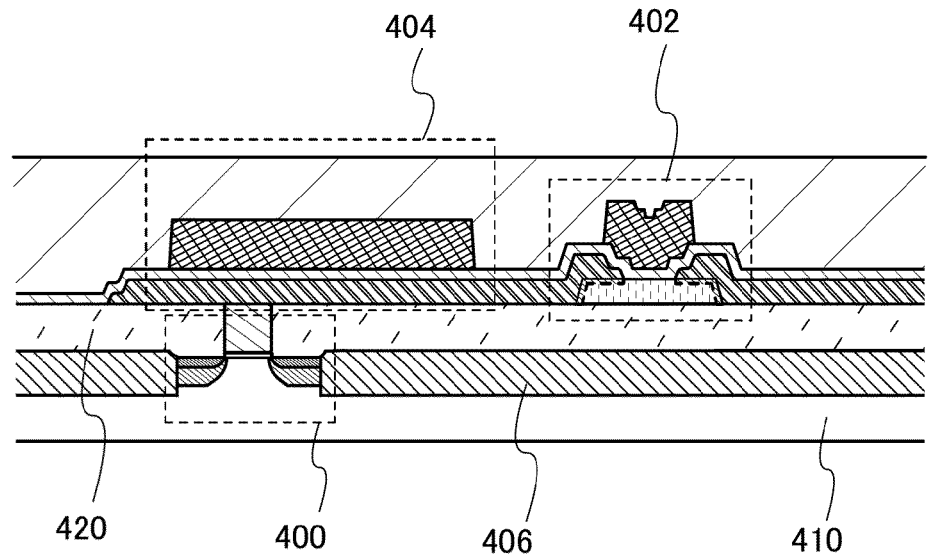
FIGS. 8A and 8B are a cross-sectional view and a circuit diagram of a semiconductor device.
Figure 8B:
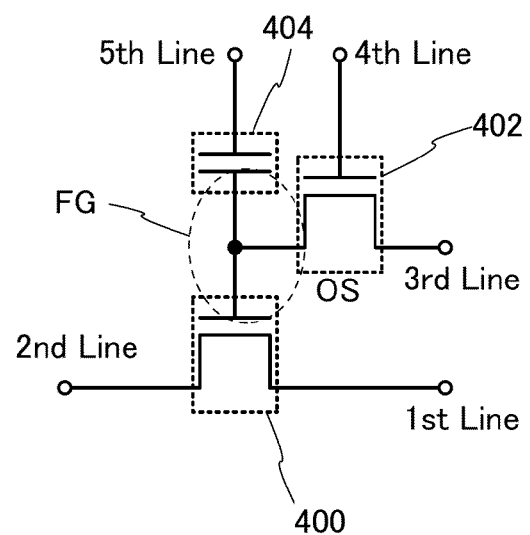

FIG. 8A is a cross-sectional view of the semiconductor device, and FIG. 8B is a circuit diagram of the semiconductor device.

The semiconductor device illustrated in FIGS. 8A and 8B includes a transistor 400 including a first semiconductor material in a lower portion, and a transistor 402 including a second semiconductor material and a capacitor 404 in an upper portion. As the transistor 402, any of the transistors described in the above embodiments can be used, and an example in which the transistor 150 described in Embodiment 1 with reference to FIGS. 1A and 1B is applied to the transistor 402 is described in this embodiment. One electrode of the capacitor 404 is formed using the same material as a gate electrode of the transistor 402, the other electrode of the capacitor 404 is formed using the same material as a source electrode and a drain electrode of the transistor 402, and a dielectric of the capacitor 404 is formed using the same material as the gate insulating film 108 of the transistor 402; thus, the capacitor 404 can be formed at the same time as the transistor 402.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although all the above transistors are n-channel transistors here, it is needless to say that p-channel transistors can be used. The specific structure of the semiconductor device, such as the material used for the semiconductor device and the structure of the semiconductor device, is not necessarily limited to that described here except for the use of the transistor described in the above embodiment, which is formed using an oxide semiconductor for storing data.

The transistor 400 in FIG. 8A includes a channel formation region provided in a substrate 410 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode provided over the gate insulating film. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, for example, in this specification, the term "source electrode" might include a source region.

An element isolation insulating layer 406 is provided over the substrate 410 so as to surround the transistor 400. An insulating film 420 is provided so as to cover the transistor 400. Note that the element isolation insulating layer 406 can be formed by an element isolation technique such as local oxidation of silicon (LOCOS) or shallow trench isolation (STI).

For example, the transistor 400 formed using a crystalline silicon substrate can operate at high speed. Thus, when the transistor is used as a reading transistor, data can be read at a high speed. As treatment prior to formation of the transistor 402 and the capacitor 404, CMP treatment is performed on the insulating film 420 covering the transistor 400, whereby the insulating film 420 is planarized and, at the same time, an upper surface of the gate electrode of the transistor 400 is exposed.

The transistor 402 is provided over the insulating film 420, and one of the source electrode and the drain electrode thereof is extended so as to function as the other electrode of the capacitor 404.

The transistor 402 in FIG. 8A is a top-gate transistor in which a channel is formed in an oxide semiconductor film. Since the off-state current of the transistor 402 is low, stored data can be held for a long period owing to such a transistor. In other words, power consumption can be sufficiently reduced because a semiconductor device in which refresh operation is unnecessary or the frequency of refresh operation is extremely low can be provided.

In the transistor 402, low-resistance regions are formed in regions in the vicinity of the interfaces of the oxide semiconductor film in contact with the source electrode and the drain electrode, and the channel formation region can be a highly purified intrinsic region by adding oxygen to the oxide semiconductor film using the source electrode and the drain electrode as masks. By the addition of oxygen, the highly purified intrinsic region and the low-resistance regions can be formed in a self-aligned manner. The amount of oxygen vacancy in the channel formation region in the oxide semiconductor film in the transistor can be reduced and the electrical characteristics of the transistor are favorable; therefore, it is possible to provide a highly reliable semiconductor device.

The transistor 400 and the transistor 402 can be formed so as to overlap with each other as illustrated in FIG. 8A, whereby the area occupied by them can be reduced. Accordingly, the degree of integration of the semiconductor device can be increased.

Next, an example of a circuit configuration corresponding to FIG. 8A is illustrated in FIG. 8B.

In FIG. 8B, a first wiring (1st Line) is electrically connected to a source electrode of the transistor 400. A second wiring (2nd Line) is electrically connected to a drain electrode of the transistor 400. A third wiring (3rd Line) and one of a source electrode and a drain electrode of the transistor 402 are electrically connected to each other, and a fourth wiring (4th Line) and a gate electrode of the transistor 402 are electrically connected to each other. The gate electrode of the transistor 400 and the other of the source electrode and the drain electrode of the transistor 402 are electrically connected to one electrode of the capacitor 404. A fifth wiring (5th Line) is electrically connected to the other electrode of the capacitor 404.

The semiconductor device in FIG. 8B utilizes a characteristic in which the potential of the gate electrode of the transistor 400 can be held, and thus can write, hold, and read data as described below.

Writing and holding of data is described. First, the potential of the fourth wiring is set to a potential at which the transistor 402 is on, so that the transistor 402 is turned on. Accordingly, the potential of the third wiring is supplied to the gate electrode of the transistor 400 and the capacitor 404. In other words, a predetermined charge is supplied to the gate electrode of the transistor 400 (i.e., writing of data). Here, charge for supplying either of two different potential levels (hereinafter referred to as a low-level charge and a high-level charge) is supplied. After that, the potential of the fourth wiring is set to a potential at which the transistor 402 is off, so that the transistor 402 is turned off. Thus, the charge supplied to the gate electrode of the transistor 400 is held (holding).

Since the off-state current of the transistor 402 is significantly small, the charge of the gate electrode of the transistor 400 is held for a long time.

Next, reading of data is described. By supplying an appropriate potential (reading potential) to the fifth wiring with a predetermined potential (constant potential) supplied to the first wiring, the potential of the second wiring varies depending on the amount of charge held in the gate electrode of the transistor 400. This is generally because, when the transistor 400 is an n-channel transistor, an apparent threshold voltage $V_{th\_H}$ in the case where the high-level charge is supplied to the gate electrode of the transistor 400 is lower than an apparent threshold voltage $V_{th\_L}$ in the case where the low-level charge is supplied to the gate electrode of the transistor 400. Here, the apparent threshold voltage refers to the potential of the fifth wiring, which is needed to turn on the transistor 400. Thus, the potential of the fifth wiring is set to a potential $V_0$ that is between $V_{th\_H}$ and $V_{th\_L}$, whereby charge supplied to the gate electrode of the transistor 400 can be determined. For example, in the case where the high-level charge is supplied in writing, when the potential of the fifth wiring is set to $V_0$ ($>V_{th\_H}$), the transistor 400 is turned on. In the case where the low-level charge is supplied in writing, even when the potential of the fifth wiring is set to $V_0$ ($<V_{th\_L}$), the transistor 400 remains in an off state. Therefore, the data held can be read by determining the potential of the second wiring.

Note that in the case where memory cells are arrayed to be used, only data of desired memory cells needs to be read. The fifth wiring in the case where data is not read may be supplied with a potential at which the transistor 400 is turned off regardless of the state of the gate electrode, that is, a potential lower than $V_{th\_H}$. Alternatively, the fifth wiring may be supplied with a potential at which the transistor 400 is turned on regardless of the state of the gate electrode, that is, a potential higher than $V_{th\_L}$.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly integrated semiconductor device having favorable electrical characteristics and a method for manufacturing the semiconductor device can be provided.

This embodiment can be combined with any of the other embodiments in this specification as appropriate.

Embodiment 4

In this embodiment, a semiconductor device including a transistor of one embodiment of the present invention, which can hold stored data even when not powered, which does not have a limitation on the number of write cycles, and which has a structure different from that described in Embodiment 3, is described.

Figure 9A:
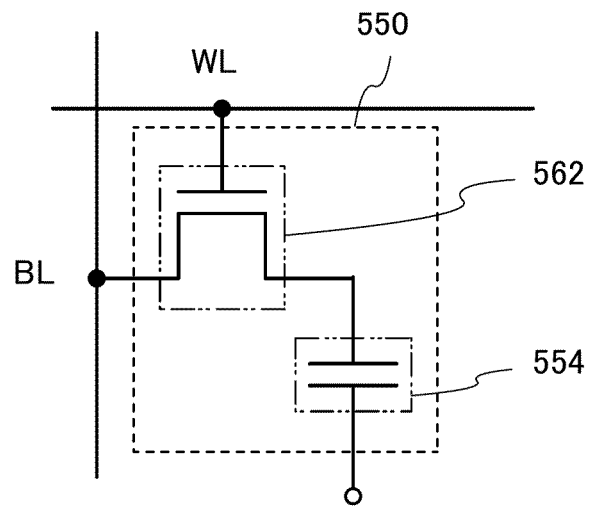
FIGS. 9A and 9B are a circuit diagram and a perspective view of a semiconductor device.
Figure 9B:
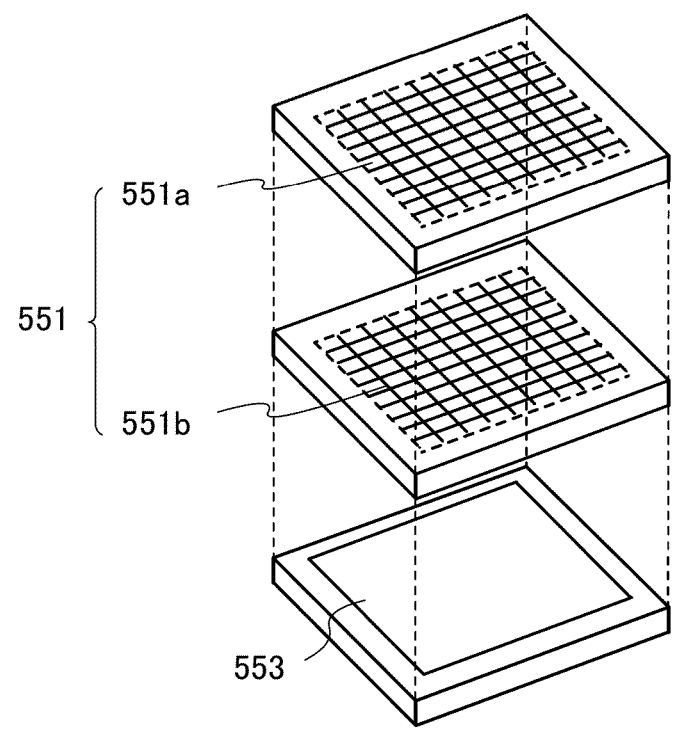

FIG. 9A illustrates an example of a circuit configuration of a semiconductor device, and FIG. 9B is a conceptual diagram illustrating an example of a semiconductor device. As a transistor 562 included in the semiconductor device, any of the transistors described in the above embodiments can be used. A capacitor 554 can be formed through the same process and at the same time as the transistor 562 in a manner similar to that of the capacitor 404 described in Embodiment 3.

In the semiconductor device illustrated in FIG. 9A, a bit line BL is electrically connected to a source electrode of the transistor 562, a word line WL is electrically connected to a gate electrode of the transistor 562, and a drain electrode of the transistor 562 is electrically connected to one terminal of the capacitor 554.

Next, writing and holding of data in the semiconductor device (a memory cell 550) illustrated in FIG. 9A is described.

First, the potential of the word line WL is set to a potential at which the transistor 562 is turned on, so that the transistor 562 is turned on. Accordingly, the potential of the bit line BL is supplied to the one terminal of the capacitor 554 (writing). After that, the potential of the word line WL is set to a potential at which the transistor 562 is turned off, so that the transistor 562 is turned off. Thus, the potential at the one terminal of the capacitor 554 is held (holding).

The transistor 562 including an oxide semiconductor has a characteristic of a significantly small off-state current. For that reason, a potential of the first terminal of the capacitor 554 (or a charge accumulated in the capacitor 554) can be held for an extremely long period by turning off the transistor 562.

Next, reading of data is described. When the field-effect transistor 562 is turned on, the bit line BL which is in a floating state and the capacitor 554 are electrically connected to each other, and the charge is redistributed between the bit line BL and the capacitor 554. As a result, the potential of the bit line BL is changed. The amount of change in potential of the bit line BL varies depending on the potential of the first terminal of the capacitor 554 (or the charge accumulated in the capacitor 554).

For example, the potential of the bit line BL after charge redistribution is $(C_B \times V_{B0} + C \times V)/(C_B + C)$, where V is the potential of the first terminal of the capacitor 554, C is the capacitance of the capacitor 554, $C_B$ is the capacitance of the bit line BL (hereinafter also referred to as bit line capacitance), and $V_{B0}$ is the potential of the bit line BL before the charge redistribution. Therefore, it can be found that assuming that the memory cell 550 is in either of two states in which the potentials of the first terminal of the capacitor 554 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 9A can hold charge that is accumulated in the capacitor 554 for a long time because the off-state current of the transistor 562 is extremely low. In other words, power consumption can be sufficiently reduced because refresh operation becomes unnecessary or the frequency of refresh operation can be extremely low. Moreover, stored data can be stored for a long time even when power is not supplied.

Next, the semiconductor device illustrated in FIG. 9B is described.

The semiconductor device illustrated in FIG. 9B includes a memory cell array 551 (memory cell arrays 551a and 551b) including the plurality of memory cells 550 illustrated in FIG. 9A as memory circuits in the upper portion, and a peripheral circuit 553 in the lower portion, which is necessary for operating the memory cell array 551. Note that the peripheral circuit 553 is electrically connected to the memory cell arrays 551.

It is preferable that a semiconductor material of the transistor provided in the peripheral circuit 553 be different from that of the transistor 562. For example, silicon, germanium, silicon germanium, silicon carbide, gallium arsenide, or the like can be used, and a single crystal semiconductor is preferably used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 9B illustrates, as an example, the semiconductor device in which the memory cell array 551 has a stack of the memory cell array 551a and the memory cell array 551b; however, the number of stacked memory cell arrays is not limited to two. For the memory cell array 551, a stack of three or more memory cell arrays may be used, or only one memory cell array may be used.

The transistor 562 is formed using an oxide semiconductor, and any of the transistors described in the above embodiments can be used as the transistor 562. Since the off-state current of the transistor including an oxide semiconductor is small, stored data can be held for a long time. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly integrated semiconductor device having favorable electrical characteristics can be provided.

This embodiment can be combined with any of the other embodiments in this specification as appropriate.

Embodiment 5

In this embodiment, examples of electronic appliances which can use any of the transistors described in the above embodiments are described.

The transistors described in the above embodiments can be applied to a variety of electronic appliances (including game machines) and electric appliances. Examples of the electronic appliances and electric appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic dictionary, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from non-aqueous secondary batteries, for example, electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like can be given. Specific examples of these electronic appliances are illustrated in FIG. 10, FIG. 11, FIGS. 12A to 12C, and FIGS. 13A to 13C.

First, as an example of the alarm device, a structure of a fire alarm is described. A fire alarm in this specification refers to any device which raises an alarm over fire occurrence instantly, and for example, a residential fire alarm, an automatic fire alarm system, and a fire detector used for the automatic fire alarm system are included in its category.

Figure 10:
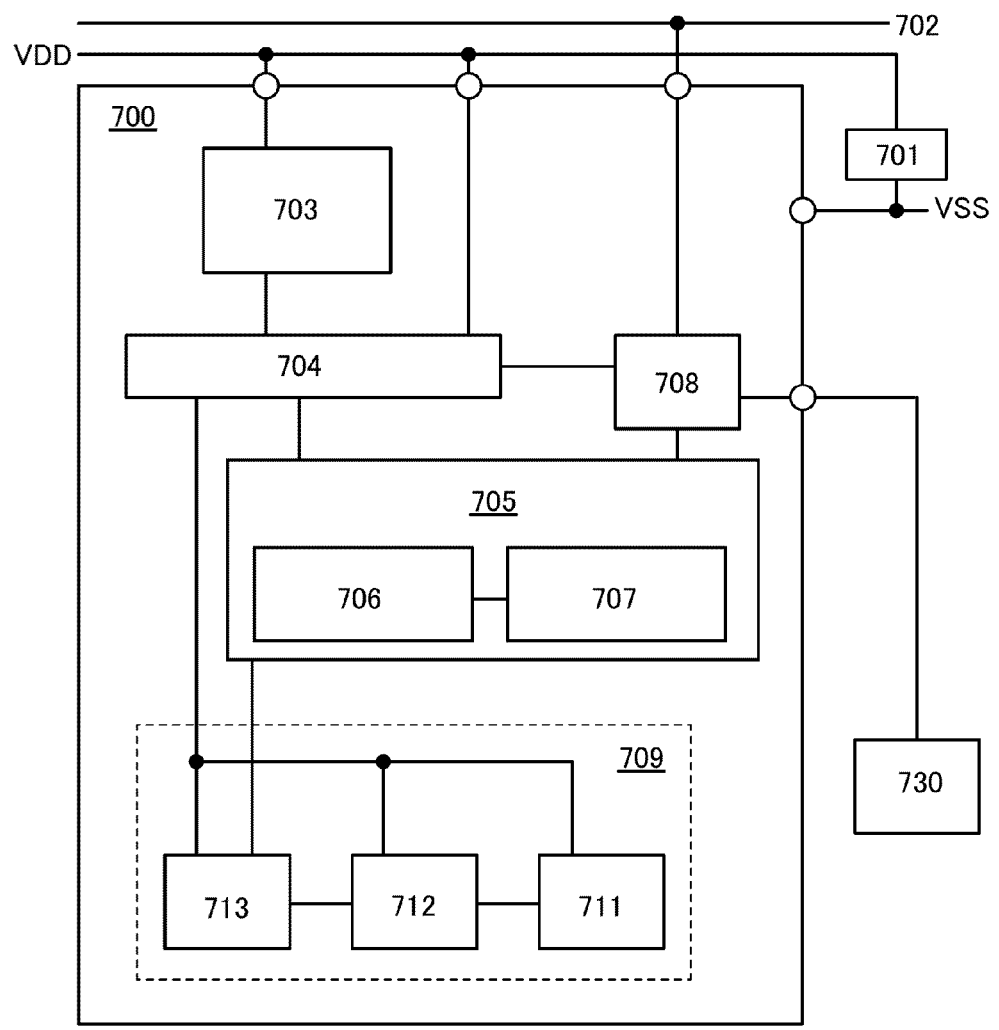
FIG. 10 is a block diagram of a semiconductor device.

An alarm device illustrated in FIG. 10 includes at least a microcomputer 700. Here, the microcomputer 700 is provided in the alarm device. The microcomputer 700 includes a power gate controller 703 electrically connected to a high potential power supply line VDD, a power gate 704 electrically connected to the high potential power supply line VDD and the power gate controller 703, a central processing unit (CPU) 705 electrically connected to the power gate 704, and a sensor portion 709 electrically connected to the power gate 704 and the CPU 705. Further, the CPU 705 includes a volatile memory portion 706 and a nonvolatile memory portion 707.

The CPU 705 is electrically connected to a bus line 702 via an interface 708. The interface 708 as well as the CPU 705 is electrically connected to the power gate 704. As a bus standard of the interface 708, an I²C bus can be used, for example. A light-emitting element 730 electrically connected to the power gate 704 through the interface 708 is provided in the alarm device described in this embodiment.

The light-emitting element 730 is preferably an element which emits light with high directivity, and for example, an organic EL element, an inorganic EL element, or a light-emitting diode (LED) can be used.

The power gate controller 703 includes a timer and controls the power gate 704 with the use of the timer. The power gate 704 allows or stops supply of power from the high potential power supply line VDD to the CPU 705, the sensor portion 709, and the interface 708, in accordance with the control by the power gate controller 703. Here, as an example of the power gate 704, a switching element such as a transistor can be given.

With the use of the power gate controller 703 and the power gate 704, power is supplied to the sensor portion 709, the CPU 705, and the interface 708 in a period during which the amount of light is measured, and supply of power to the sensor portion 709, the CPU 705, and the interface 708 can be stopped during an interval between measurement periods. The alarm device operates in such a manner, whereby power consumption can be reduced compared with a case where power is continuously supplied to the above structures.

In the case where a transistor is used as the power gate 704, it is preferable to use a transistor which has an extremely low off-state current and is used for the nonvolatile memory portion 707, for example, a transistor including an oxide semiconductor. With the use of such a transistor, leakage current can be reduced when supply of power is stopped by the power gate 704, so that power consumption can be reduced.

A direct-current power source 701 may be provided in the alarm device described in this embodiment so that power is supplied from the direct-current power source 701 to the high potential power supply line VDD. An electrode of the direct-current power source 701 on a high potential side is electrically connected to the high potential power supply line VDD, and an electrode of the direct-current power source 701 on a low potential side is electrically connected to a low potential power supply line VSS. The low potential power supply line (VSS) is electrically connected to the microcomputer 700. Here, the high potential power supply line VDD is supplied with a high potential H. The low potential power supply line VSS is supplied with a low potential L, e.g., a ground potential (GND).

In the case where a battery is used as the direct-current power source 701, for example, a battery case including an electrode electrically connected to the high potential power supply line VDD, an electrode electrically connected to the low potential power supply line VSS, and a housing which can hold the battery, is provided in a housing. Note that the alarm device described in this embodiment does not necessarily include the direct-current power source 701 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 709 measures a physical quantity relating to an abnormal situation and transmits a measurement value to the CPU 705. The physical quantity relating to an abnormal situation depends on the usage of the alarm device, and in an alarm device functioning as a fire alarm, a physical quantity relating to a fire is measured. Accordingly, the sensor portion 709 measures the amount of light as the physical quantity relating to a fire and senses smoke.

The sensor portion 709 includes an optical sensor 711 electrically connected to the power gate 704, an amplifier 712 electrically connected to the power gate 704, and an AD converter 713 electrically connected to the power gate 704 and the CPU 705. The optical sensor 711, the amplifier 712, and the AD converter 713 which are provided in the sensor portion 709, and the light-emitting element 730 operate when the power gate 704 allows supply of power to the sensor portion 709.

Figure 11:
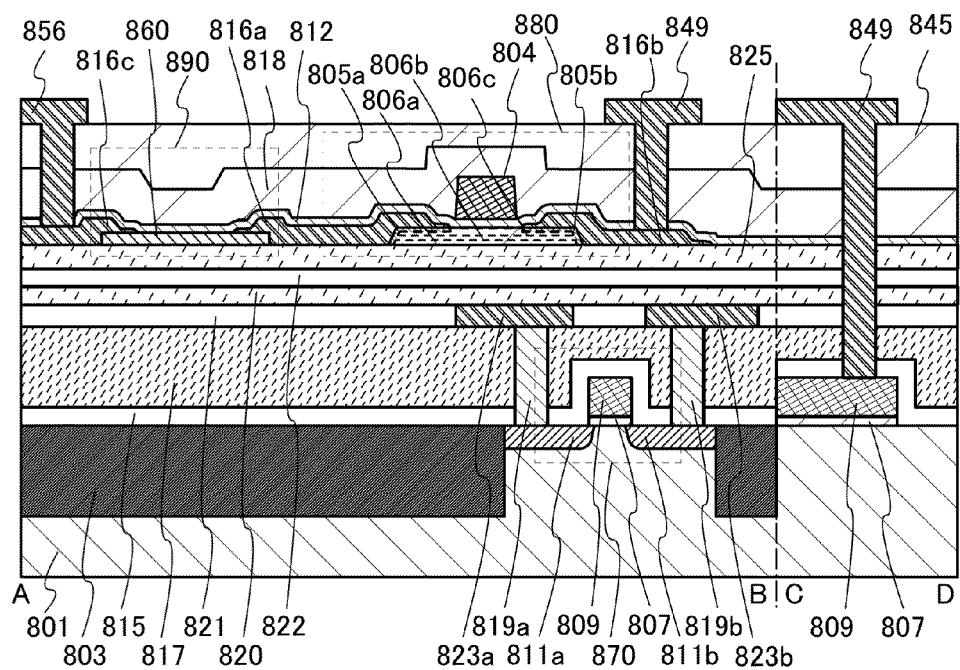
FIG. 11 is a cross-sectional view of a semiconductor device.

FIG. 11 illustrates part of the cross section of the alarm system. In the alarm device, element isolation regions 803 are formed in a p-type semiconductor substrate 801, and an n-channel transistor 870 including a gate insulating film 807, a gate electrode 809, n-type impurity regions 811a and 811b, an insulating film 815, and an insulating film 817 is formed. Here, the n-channel transistor 870 is formed using a semiconductor other than an oxide semiconductor, such as single crystal silicon, so that the n-channel transistor 870 can operate at sufficiently high speed. Accordingly, a volatile memory portion of a CPU that can achieve high-speed access can be formed.

In addition, contact plugs 819a and 819b are formed in openings which are formed by partly etching the insulating films 815 and 817, and an insulating film 821 having groove portions is formed over the insulating film 817 and the contact plugs 819a and 819b.

Wirings 823a and 823b are formed in the groove portions of the insulating film 821, and an insulating film 820 formed by a sputtering method, a CVD method, or the like is provided over the insulating film 821 and the wirings 823a and 823b. An insulating film 822 having a groove portion is formed over the insulating film.

An insulating film 825 formed by a sputtering method, a CVD method, or the like is provided over the insulating film 822, and a second transistor 880 and a photoelectric conversion element 890 are provided over the insulating film 825.

The second transistor 880 includes an oxide film 806a; an oxide semiconductor film 806b; an oxide film 806c; a low-resistance region 805a and a low-resistance region 805b which are in contact with the oxide film 806a, the oxide semiconductor film 806b, and the oxide film 806c; a source electrode 816a and a drain electrode 816b which are in contact with the low-resistance region 805a and the low-resistance region 805b; a gate insulating film 812; a gate electrode 804; and an oxide insulating film 818. Moreover, an insulating film 845 which covers the photoelectric conversion element 890 and the second transistor 880 is formed, and a wiring 849 in contact with the drain electrode 816b is formed over the insulating film 845. The wiring 849 functions as the node which electrically connects a drain electrode of the second transistor 880 to the gate electrode 809 of the n-channel transistor 870. Note that a cross section C-D in the drawing shows a cross section in the depth direction of the transistor 870 in the cross section A-B.

Here, the transistor 250 described in the above embodiment can be used as the second transistor 880, and the oxide film 806*a*, the oxide semiconductor film 806*b*, and the oxide film 806*c* correspond to the oxide film 204*a*, the oxide semiconductor film 204*b*, and the oxide film 204*c* described in Embodiment 2, respectively. Moreover, the source electrode 816*a* and the drain electrode 816*b* correspond to the source electrode 106*a* and the drain electrode 106*b* described in Embodiment 1, respectively.

In the transistor 880, low-resistance regions are formed in regions in the vicinity of the interfaces of the multilayer film in contact with the source electrode and the drain electrode, and the channel formation region can be a highly purified intrinsic region by adding oxygen to the multilayer film using the source electrode and the drain electrode as masks. The amount of oxygen vacancy in the channel formation region in the multilayer film in the transistor can be reduced and the electrical characteristics of the transistor are favorable; therefore, it is possible to provide a highly reliable semiconductor device.

The optical sensor 711 includes the photoelectric conversion element 890, a capacitor, a first transistor, the second transistor 880, a third transistor, and the n-channel transistor 870. As the photoelectric conversion element 890, a photodiode can be used here, for example.

One of terminals of the photoelectric conversion element 890 is electrically connected to the low potential power supply line VSS, and the other of the terminals thereof is electrically connected to one of the source electrode 816*a* and the drain electrode 816*b* of the second transistor 880.

The gate electrode 804 of the second transistor 880 is supplied with an electric charge accumulation control signal Tx, and the other of the source electrode 816*a* and the drain electrode 816*b* of the second transistor 880 is electrically connected to one of a pair of electrodes of the capacitor, one of a source electrode and a drain electrode of the first transistor, and the gate electrode of the n-channel transistor 870 (hereinafter the node is referred to as a node FD in some cases).

The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD.

One of a source electrode and a drain electrode of the n-channel transistor 870 is electrically connected to one of a source electrode and a drain electrode of the third transistor and the amplifier 712. The other of the source electrode and the drain electrode of the n-channel transistor 870 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 870 or the like is sufficiently large, a structure without the capacitor may be employed.

Further, as each of the first transistor and the second transistor 880, the transistor having an extremely low off-state current is preferably used. As the transistor having an extremely low off-state current, a transistor including an oxide semiconductor is preferably used. With such a structure, the potential of the node FD can be held for a long time.

In the structure in FIG. 11, the photoelectric conversion element 890 is electrically connected to the second transistor 880 and is provided over the insulating film 825.

The photoelectric conversion element 890 includes a semiconductor film 860 provided over the insulating film 825, and the source electrode 816*a* and an electrode 816*c* which are in contact with a top surface of the semiconductor film 860. The source electrode 816*a* is an electrode functioning as the source electrode or the drain electrode of the second transistor 880 and electrically connects the photoelectric conversion element 890 to the second transistor 880.

Over the semiconductor film 860, the source electrode 816*a*, and the electrode 816*c*, the gate insulating film 812, the oxide insulating film 818, and the insulating film 845 are provided. Further, a wiring 856 is formed over the insulating film 845 and is in contact with the electrode 816*c* through an opening provided in the gate insulating film 812, the oxide insulating film 818, and the insulating film 845.

The electrode 816*c* can be formed in steps similar to those of the source electrode 816*a* and the drain electrode 816*b*, and the wiring 856 can be formed in steps similar to those of the wiring 849.

As the semiconductor film 860, a semiconductor film which can perform photoelectric conversion is provided, and for example, silicon or germanium can be used. In the case of using silicon for the semiconductor film 860, an optical sensor which senses visible light can be obtained. Further, there is a difference, between silicon and germanium, in wavelengths of electromagnetic waves that can be absorbed. When the semiconductor film 860 includes germanium, a sensor which mainly senses an infrared ray can be obtained.

In the above manner, the sensor portion 709 including the optical sensor 711 can be incorporated into the microcomputer 700, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 700.

In the alarm device including the above-described IC chip, the CPU 705 in which a plurality of circuits including any of the transistors described in the above embodiments are combined and mounted on one IC chip is used.

Figure 12A:
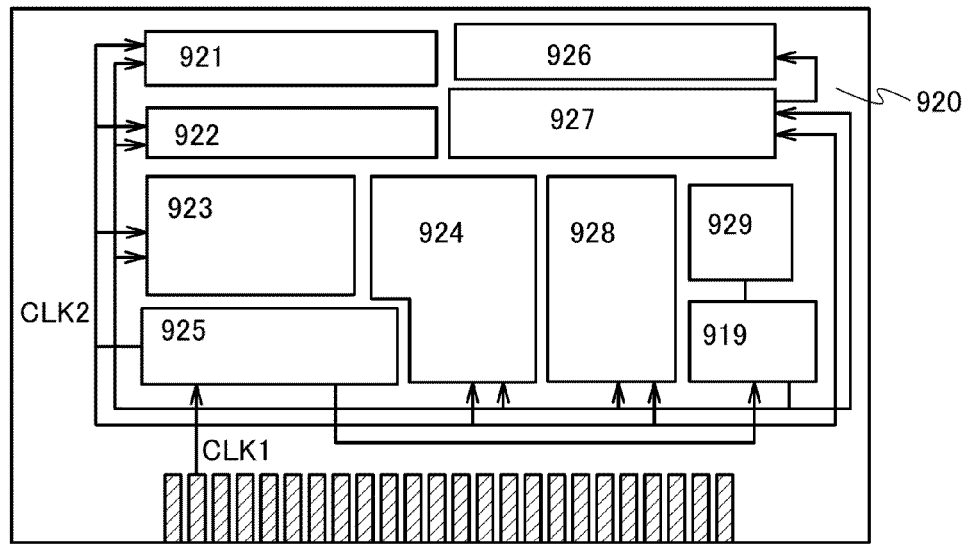
FIGS. 12A to 12C are block diagrams of a semiconductor device.
Figure 12B:
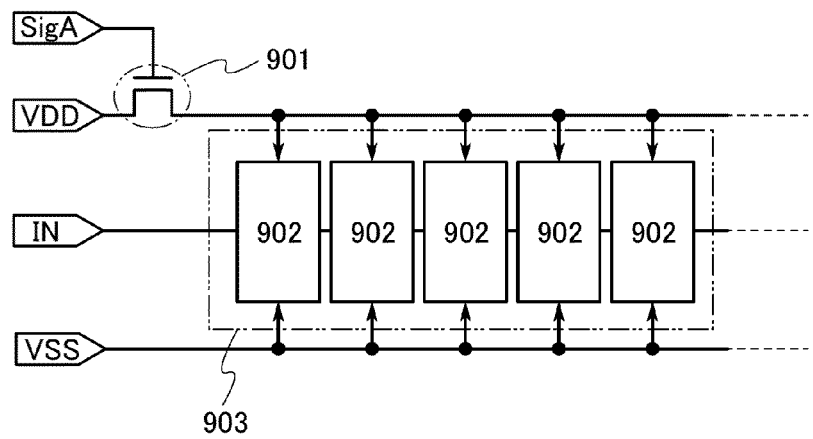
Figure 12C:
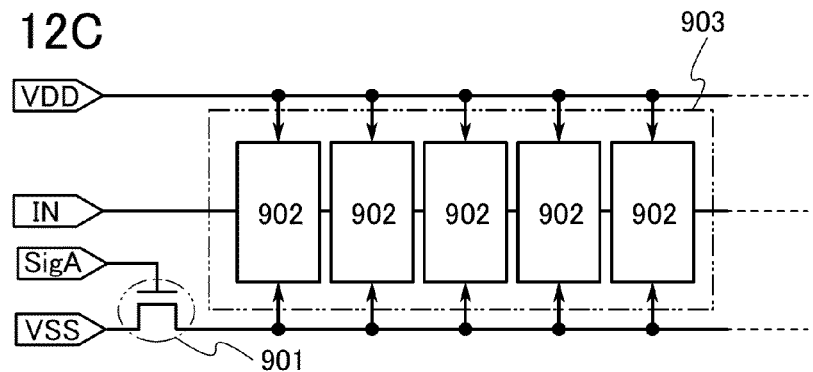

FIGS. 12A to 12C are block diagrams illustrating a specific configuration of a CPU at least partly including any of the transistors described in the above embodiments.

The CPU illustrated in FIG. 12A includes an arithmetic logic unit (ALU) 921, an ALU controller 922, an instruction decoder 923, an interrupt controller 924, a timing controller 925, a register 926, a register controller 927, a bus interface (Bus I/F) 928, a rewritable ROM 929, and an ROM interface (ROM I/F) 919 over a substrate 920. A semiconductor substrate, an SOI substrate, a glass substrate, or the like is used as the substrate 920. The ROM 929 and the ROM interface 919 may be provided over a separate chip. It is needless to say that the CPU illustrated in FIG. 12A is only an example in which the configuration is simplified, and actual CPUs have various configurations depending on applications.

An instruction that is input to the CPU through the bus interface 928 is input to the instruction decoder 923 and decoded therein, and then, input to the ALU controller 922, the interrupt controller 924, the register controller 927, and the timing controller 925.

The ALU controller 922, the interrupt controller 924, the register controller 927, and the timing controller 925 conduct various controls in accordance with the decoded instruction. Specifically, the ALU controller 922 generates signals for controlling the operation of the ALU 921. While the CPU is executing a program, the interrupt controller 924 determines an interrupt request from an external input/output device or a peripheral circuit on the basis of its priority or a mask state, and processes the request. The register controller 927 generates an address of the register 926, and reads/writes data from/to the register 926 in accordance with the state of the CPU.

The timing controller 925 generates signals for controlling operation timings of the ALU 921, the ALU controller 922, the instruction decoder 923, the interrupt controller 924, and the register controller 927. For example, the timing controller 925 includes an internal clock generator for generating an internal clock signal CLK2 based on a reference clock signal CLK1, and supplies the internal clock signal CLK2 to the above circuits.

In the CPU illustrated in FIG. 12A, a memory cell is provided in the register 926. As the memory cell of the register 926, any of the transistors described in the above embodiments can be used.

In the CPU illustrated in FIG. 12A, the register controller 927 selects operation of storing data in the register 926 in accordance with an instruction from the ALU 921. That is, the register controller 927 selects whether data is stored by a flip-flop or by a capacitor in the memory cell included in the register 926. When data storing by the flip-flop is selected, a power supply voltage is supplied to the memory cell in the register 926. When data storing by the capacitor is selected, the data is rewritten in the capacitor, and supply of power supply voltage to the memory cell in the register 926 can be stopped.

The power supply can be stopped by a switching element provided between a memory cell group and a node to which a power supply potential VDD or a power supply potential VSS is supplied, as illustrated in FIG. 12B or FIG. 12C. Circuits illustrated in FIGS. 12B and 12C are be described below.

FIGS. 12B and 12C each illustrate an example of the configuration of a memory circuit in which any of the transistors described in the above embodiments is used as a switching element which controls supply of a power supply potential to a memory cell.

The memory device illustrated in FIG. 12B includes a switching element 901 and a memory cell group 903 including a plurality of memory cells 902. Specifically, as each of the memory cells 902, any of the transistors described in the above embodiments can be used. Each of the memory cells 902 included in the memory cell group 903 is supplied with the high-level power supply potential VDD via the switching element 901. Further, each of the memory cells 902 included in the memory cell group 903 is supplied with a potential of a signal IN and the low-level power supply potential VSS.

In FIG. 12B, any of the transistors described in the above embodiments is used as the switching element 901, and the switching of the transistor is controlled by a signal SigA supplied to a gate electrode thereof.

Note that FIG. 12B illustrates the structure in which the switching element 901 includes only one transistor; however, one embodiment of the present invention is not limited thereto and the switching element 901 may include a plurality of transistors. In the case where the switching element 901 includes a plurality of transistors which function as switching elements, the plurality of transistors may be connected to each other in parallel, in series, or in combination of parallel connection and series connection.

Although the switching element 901 controls the supply of the high-level power supply potential VDD to each of the memory cells 902 included in the memory cell group 903 in FIG. 12B, the switching element 901 may control the supply of the low-level power supply potential VSS.

In FIG. 12C, an example of a memory device in which each of the memory cells 902 included in the memory cell group 903 is supplied with the low-level power supply potential VSS via the switching element 901 is illustrated. The supply of the low-level power supply potential VSS to each of the memory cells 902 included in the memory cell group 903 can be controlled by the switching element 901.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Figure 13A:
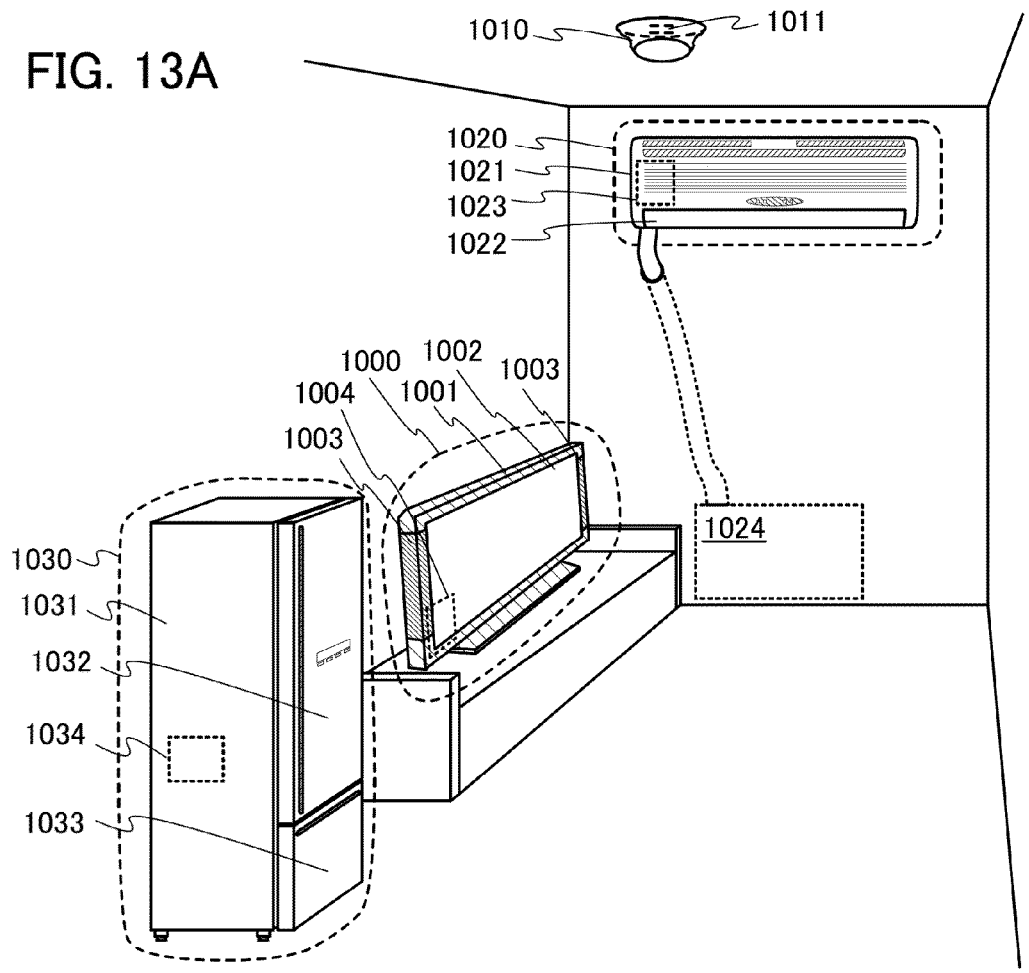
FIGS. 13A to 13C illustrate electronic appliances to which a semiconductor device can be applied.

In FIG. 13A, a display device 1000 is an example of an electric appliance including the CPU in which any of the transistors described in the above embodiments is used. The display device 1000 corresponds to a display device for TV broadcast reception and includes a housing 1001, a display portion 1002, speaker portions 1003, a CPU 1004, and the like. The CPU 1004 is provided in the housing 1001. The display device 1000 can receive electric power from a commercial power supply. Alternatively, the display device 1000 can use electric power stored in a power storage device. When any of the transistors described in the above embodiments is used as the CPU in the display device 1000, a reduction in power consumption of the display device 1000 can be achieved.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), a field emission display (FED), and the like can be used in the display portion 1002.

Note that the display device includes, in its category, all of information display devices for personal computers, advertisement displays, and the like besides TV broadcast reception.

In FIG. 13A, an alarm device 1010 is a residential fire alarm, which includes a sensor portion and a microcomputer 1011. Note that the microcomputer 1011 is an example of an electric appliance including the CPU in which any of the transistors described in the above embodiments is used.

In FIG. 13A, an air conditioner which includes an indoor unit 1020 and an outdoor unit 1024 is an example of an electric appliance including the CPU in which any of the transistors described in the above embodiments is used. Specifically, the indoor unit 1020 includes a housing 1021, an air outlet 1022, a CPU 1023, and the like. Although the CPU 1023 is provided in the indoor unit 1020 in FIG. 13A, the CPU 1023 may be provided in the outdoor unit 1024. Alternatively, the CPU 1023 may be provided in both the indoor unit 1020 and the outdoor unit 1024. By using any of the transistors described in the above embodiments for the CPU in the air conditioner, a reduction in power consumption of the air conditioner can be achieved.

In FIG. 13A, an electric refrigerator-freezer 1030 is an example of an electric appliance including the CPU in which any of the transistors described in the above embodiments is used. Specifically, the electric refrigerator-freezer 1030 includes a housing 1031, a door for a refrigerator 1032, a door for a freezer 1033, a CPU 1034, and the like. In FIG. 13A, the CPU 1034 is provided in the housing 1031. When any of the transistors described in the above embodiments is used as the CPU 1034 of the electric refrigerator-freezer 1030, a reduction in power consumption of the electric refrigerator-freezer 1030 can be achieved.

Figure 13B:
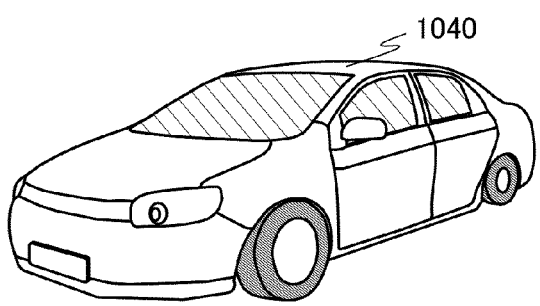
Figure 13C:
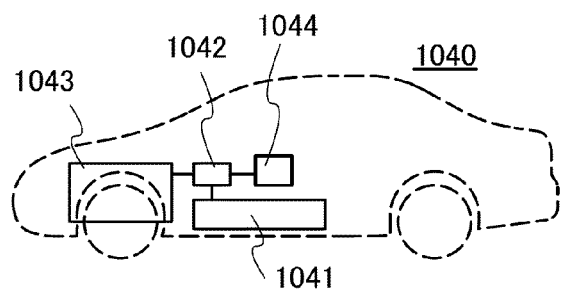

FIG. 13B illustrates an example of an electric vehicle which is an example of an electric appliance. An electric vehicle 1040 is equipped with a secondary battery 1041. The output of the electric power of the secondary battery 1041 is adjusted by a control circuit 1042 and the electric power is supplied to a driving device 1043. The control circuit 1042 is controlled by a processing unit 1044 including a ROM, a RAM, a CPU, or the like which is not illustrated. When any of the transistors described in the above embodiments is used as the CPU in the electric vehicle 1040, a reduction in power consumption of the electric vehicle 1040 can be achieved.

The driving device 1043 includes a DC motor or an AC motor either alone or in combination with an internal-combustion engine. The processing unit 1044 outputs a control signal to the control circuit 1042 based on input data such as data of operation (e.g., acceleration, deceleration, or stop) by a driver or data during driving (e.g., data on an upgrade or a downgrade, or data on a load on a driving wheel) of the electric vehicle 1040. The control circuit 1042 adjusts the electric energy supplied from the secondary battery 1041 in accordance with the control signal of the processing unit 1044 to control the output of the driving device 1043. In the case where the AC motor is mounted, although not illustrated, an inverter which converts direct current into alternate current is also incorporated.

This embodiment can be combined with any of the other embodiments in this specification as appropriate.

Example 1

In this example, an observation result of a surface of an oxide semiconductor film processed using a hard mask is described. A method for fabricating an example sample is described.

First, a thermal oxidation film and a silicon oxide film were deposited over a silicon wafer as base insulating films. A sputtering method was used in the deposition of the silicon oxide film. The thermal oxidation film was deposited to a thickness of 100 nm at 950° C. in an oxygen atmosphere containing HCl at 3%. Next, a 300-nm-thick silicon oxide film was deposited over the thermal oxidation film by a sputtering method. The silicon oxide film was deposited in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the deposition of the silicon oxide film was set at 100° C.

Next, an oxide film was formed over the silicon oxide film. A 20-nm-thick In—Ga—Zn oxide film having an atomic ratio of In:Ga:Zn=1:3:2 was deposited as the oxide film. The In—Ga—Zn oxide film was deposited under the following conditions: a sputtering target having an atomic ratio of In:Ga:Zn=1:3:2 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 200° C.

Next, a 15-nm-thick In—Ga—Zn oxide film having an atomic ratio of In:Ga:Zn=1:1:1 was deposited as an oxide semiconductor film over the oxide film. The In—Ga—Zn oxide film was deposited under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 300° C.

Next, a 5-nm-thick tungsten film was deposited as a hard mask over the oxide semiconductor film. The tungsten film was deposited under the following conditions: argon and heated argon were supplied to a treatment chamber of a sputtering apparatus as a sputtering gas at flow rates of 80 sccm and 10 sccm, respectively; the pressure in the treatment chamber was controlled to 0.8 Pa; and a DC power of 1.0 kW was supplied. Note that the substrate temperature in the deposition of the tungsten film was set at 200° C.

Next, as an organic coating film, SWK-T7 (manufactured by TOKYO OHKA KOGYO CO., LTD) was applied to have a thickness of 20 nm to the tungsten film serving as the hard mask. Moisture had been removed by heating at 200° C. for 120 seconds before the application of SWK-T7 (manufactured by TOKYO OHKA KOGYO CO., LTD). Subsequently, 1,1,1,3,3,3-hexamethyldisilazane (HMDS) was further applied to SWK-T7 and then moisture was removed by heating at 110° C. for 60 seconds. Then, a solvent and moisture were removed by heating at 200° C. for 200 seconds.

Next, a resist was formed over the organic coating film. As the resist, a negative resist OEBR-CAN034A2 (manufactured by TOKYO OHKA KOGYO CO., LTD) was deposited to have a thickness of 100 nm. Moisture had been removed by heating at 200° C. for 120 seconds before OEBR-CAN034A2 (manufactured by TOKYO OHKA KOGYO CO., LTD) was deposited. Subsequently, HMDS was further applied to OEBR-CAN034A2 and then moisture was removed by heating at 110° C. for 60 seconds. Then, a solvent and moisture were removed by heating at 100° C. for 100 seconds.

Next, a resist mask was formed through light exposure and development. Multiple light exposure was performed by an electron beam exposure apparatus and the amount of light exposure was 80 $\mu C/cm^2$ to 160 $\mu C/cm^2$ (preferably 130 $\mu C/cm^2$ to 155 $\mu C/cm^2$). After the light exposure, post exposure bake (PEB) was performed at 100° C. for 100 seconds. The development was performed under the following conditions: NMD-3 (manufactured by TOKYO OHKA KOGYO CO., LTD) was used as a developer and the development time was 60 seconds. In such a manner, the resist mask was formed.

Next, the organic coating film and the hard mask were etched using the resist mask as a mask. The etching conditions were set as follows. First, $CF_4$ with a flow rate of 100 sccm was used as the etching gas, the bias power was 50 W, the power of the ICP power source was 2000 W, and the pressure was 0.67 Pa; then, a mixed gas of $CF_4$ and $O_2$ at a flow rate ratio of $CF_4:O_2$=60 sccm:40 sccm was used as the etching gas, the bias power was 25 W, the power of the ICP power source was 1000 W, and the pressure was 2.0 Pa.

Then, the resist mask and the organic coating film were removed by ashing using oxygen plasma. The ashing conditions were as follows: the flow rate of oxygen was 100 sccm, the power of the power source was 200 W, the pressure was 500 mTorr, and the ashing time was 120 seconds.

Next, the oxide semiconductor film and the oxide film were etched using the hard mask as a mask. The etching conditions were as follows: a mixed gas of $CH_4$ and Ar at a flow rate ratio of $CH_4$:Ar=16 sccm:32 sccm was used as the etching gas, the bias power was 100 W, the power of the ICP power source was 600 W, and the pressure was 1.0 Pa.

Next, the hard mask was etched to be removed. The etching conditions were as follows: a mixed gas of $CF_4$ and $O_2$ at a flow rate ratio of $CF_4:O_2$=60 sccm:40 sccm was used as the etching gas, the bias power was 1000 W, the power of the ICP power source was 25 W, and the pressure was 2.0 Pa.

In this manner, the example sample was fabricated. Further, a comparative sample was also fabricated without using a hard mask and an organic coating film.

Figure 14A:
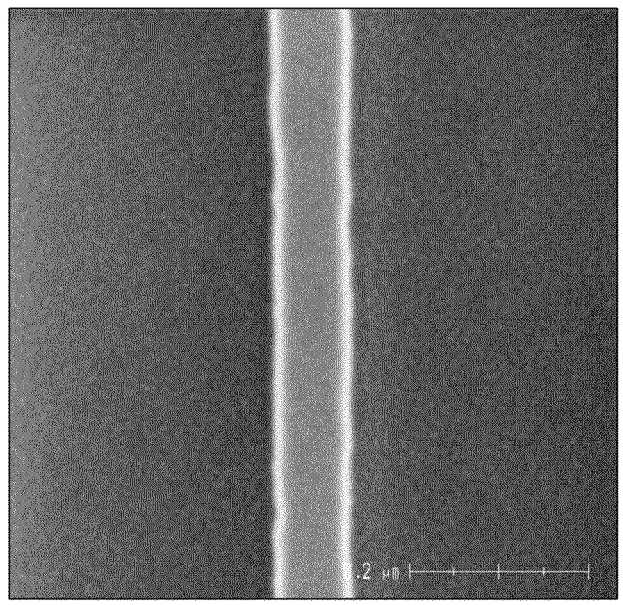
FIGS. 14A and 14B are SEM images of samples fabricated in Example.
Figure 14B:
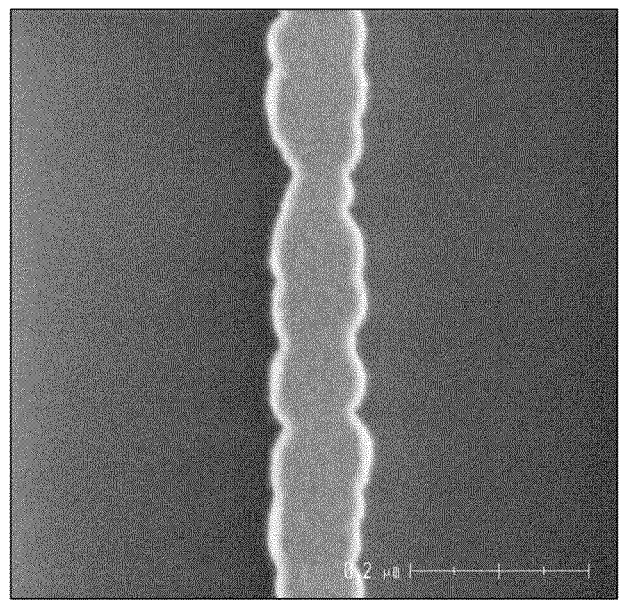

Then, a surface of each sample was observed with a scanning electron microscope (SEM). FIGS. 14A and 14B show SEM images of the samples.

FIG. 14A shows the SEM image of the example sample and FIG. 14B shows the SEM image of the comparative sample.

The line width showed in FIG. 14A was measured and then variations in the line width were calculated. As a result, a difference in the width of the oxide semiconductor film between the widest portion and the narrowest portion of was 2.93 nm when seen from the surface. Further, the standard deviation of line edge roughness on the left side of the SEM image was 3.92 nm and the standard deviation of line edge roughness on the right side of the SEM image was 3.73 nm. Furthermore, the standard deviation of line edge roughness in the case where the line width was measured in 32 points was 2.81 nm.

The line width showed in FIG. 14B was measured and then variations in the line width were calculated. As a result, a difference in the width of the oxide semiconductor film between the widest portion and the narrowest portion of was 27.95 nm when seen from the surface. Further, the standard deviation of line edge roughness on the left side of the SEM image was 9.26 nm and the standard deviation of line edge roughness on the right side of the SEM image was 13.98 nm. Furthermore, the standard deviation of line edge roughness in the case where the line width was measured in 32 points was 19.97 nm.

Thus, it was confirmed that the oxide semiconductor film processed using the hard mask and the organic coating film has less and smaller unevenness at an end portion than the oxide semiconductor film fabricated without using the hard mask and the organic coating film has. Further, it was confirmed that variations in the line width of the oxide semiconductor film processed using the hard mask and the organic coating film are smaller than those in the line width of the oxide semiconductor film fabricated without using the hard mask and the organic coating film.

This application is based on Japanese Patent Application serial no. 2013-016182 filed with Japan Patent Office on Jan. 30, 2013, the entire contents of which are hereby incorporated by reference.

What is claimed is:

1. A method for manufacturing a semiconductor device, comprising the steps of:
    forming an oxide semiconductor film over an insulating surface;
    forming a hard mask over the oxide semiconductor film, the hard mask containing at least one of Ti, Mo, Ta, and W;
    forming a resist over the hard mask;
    performing light exposure to form a resist mask;
    processing the hard mask using the resist mask to form a processed hard mask;
    processing the oxide semiconductor film using the processed hard mask;
    removing the resist mask and the processed hard mask;
    forming a source electrode and a drain electrode in contact with the oxide semiconductor film;
    forming a gate insulating film over the source electrode and the drain electrode; and
    forming a gate electrode over the gate insulating film, the gate electrode overlapping with the oxide semiconductor film.

2. The method for manufacturing a semiconductor device according to claim 1, wherein the light exposure is an electron beam exposure.

3. The method for manufacturing a semiconductor device according to claim 1, wherein the light exposure is a liquid immersion exposure.

4. A method for manufacturing a semiconductor device, comprising the steps of:
    forming an oxide semiconductor film over an insulating surface;
    forming a hard mask over the oxide semiconductor film;
    forming an organic coating film over the hard mask;
    forming a resist over the organic coating film;
    performing light exposure to form a resist mask;
    processing the organic coating film and the hard mask using the resist mask to form a processed hard mask;
    processing the oxide semiconductor film using the processed hard mask;
    removing the resist mask, the organic coating film, and the processed hard mask;
    forming a source electrode and a drain electrode in contact with the oxide semiconductor film;
    forming a gate insulating film over the source electrode and the drain electrode; and
    forming a gate electrode over the gate insulating film, the gate electrode overlapping with the oxide semiconductor film.

5. The method for manufacturing a semiconductor device according to claim 2, wherein the light exposure is an electron beam exposure.

6. The method for manufacturing a semiconductor device according to claim 4, wherein the light exposure is a liquid immersion exposure.

7. The method for manufacturing a semiconductor device according to claim 4, wherein the hard mask contains at least one of Ti, Mo, Ta, and W.

8. A semiconductor device comprising:
    an oxide semiconductor film over an insulating surface;
    a source electrode and a drain electrode in contact with the oxide semiconductor film;
    a gate insulating film over the source electrode and the drain electrode;
    a gate electrode over the gate insulating film, the gate electrode overlapping with the oxide semiconductor film; and a first oxide film and a second oxide film between which the oxide semiconductor film is positioned, wherein the first oxide film and the second oxide film each contain at least one of In and Ga, wherein an energy of a bottom of a conduction band in each of the first oxide film and the second oxide film is closer to a vacuum level than an energy of a bottom of a conduction band in the oxide semiconductor film by 0.05 eV or higher and 2 eV or lower, wherein a distance between the source electrode and the drain electrode is greater than or equal to 1 nm and less than or equal to 30 nm, and wherein a standard deviation of line edge roughness of the oxide semiconductor film is less than or equal to 4 nm.

9. The semiconductor device according to claim 8, further comprising:

a first low-resistance region between the oxide semiconductor film and the source electrode; and a second low-resistance region between the oxide semiconductor film and the drain electrode.

\* \* \* \* \*

UNITED STATES PATENT AND TRADEMARK OFFICE
CERTIFICATE OF CORRECTION

| | |
|---|---|
| PATENT NO. | : 9,076,825 B2 |
| APPLICATION NO. | : 14/162364 |
| DATED | : July 7, 2015 |
| INVENTOR(S) | : Yamamoto et al. |

It is certified that error appears in the above-identified patent and that said Letters Patent is hereby corrected as shown below:

In the claims

Column 40, line 51, claim 5, after "claim" replace "2" with --4--.

Signed and Sealed this
Fourteenth Day of June, 2016

Michelle K. Lee
*Director of the United States Patent and Trademark Office*